United States Patent
Kim

(10) Patent No.: US 8,659,031 B2
(45) Date of Patent: Feb. 25, 2014

(54) METHOD OF PRODUCING TEMPLATE FOR EPITAXIAL GROWTH AND NITRIDE SEMICONDUCTOR DEVICE

(75) Inventor: Myunghee Kim, Aichi (JP)

(73) Assignee: Soko Kagaku Co., Ltd., Aichi (JP)

( * ) Notice: Subject to any disclaimer, the term of this patent is extended or adjusted under 35 U.S.C. 154(b) by 0 days.

(21) Appl. No.: 13/700,667

(22) PCT Filed: Jun. 7, 2010

(86) PCT No.: PCT/JP2010/059589
§ 371 (c)(1),
(2), (4) Date: Nov. 28, 2012

(87) PCT Pub. No.: WO2011/155010
PCT Pub. Date: Dec. 15, 2011

(65) Prior Publication Data
US 2013/0069079 A1 Mar. 21, 2013

(51) Int. Cl.
*H01L 29/15* (2006.01)
(52) U.S. Cl.
USPC .............. 257/76; 257/E21.108; 257/E29.089; 438/479
(58) Field of Classification Search
USPC .............. 257/76, E21.108, E29.089; 438/479
See application file for complete search history.

(56) References Cited

U.S. PATENT DOCUMENTS

| | | | |
|---|---|---|---|
| 6,426,519 B1 | 7/2002 | Asai et al. | |
| 7,141,444 B2 * | 11/2006 | Koike et al. | 438/34 |
| 7,799,593 B2 * | 9/2010 | Lee et al. | 438/44 |
| 2005/0142876 A1 * | 6/2005 | Katona et al. | 438/688 |

(Continued)

FOREIGN PATENT DOCUMENTS

| | | |
|---|---|---|
| JP | 2002289538 A | 10/2002 |
| JP | 3455512 B2 | 10/2003 |

(Continued)

OTHER PUBLICATIONS

Nagamatsu, Kentaro et al.; "High-efficiency AlGaN-based UV light-emitting diode on laterally overgrown AlN; Journal of Crystal Growth"; 310; pp. 2326-2329; 2008.
Nakano, K. et al.; "Epitaxial lateral overgrowth of AlN layers on patterned sapphire substrates"; phys. stat. sol. (a) 203, No. 7; pp. 1632-1635; 2006.

(Continued)

*Primary Examiner* — Trung Q Dang
(74) *Attorney, Agent, or Firm* — Haynes Beffel & Wolfeld LLP

(57) ABSTRACT

A surface of a sapphire (0001) substrate is processed so as to have recesses and protrusions so that protrusion tops are made flat and have a given plan-view pattern. An initial-stage AlN layer is epitaxially grown on the surface of the sapphire (0001) substrate so that new recesses are formed over the recesses, by performing C axis orientation control so that a C+ axis oriented AlN layer grows on flat surfaces of the protrusion tops, excluding edges. A first ELO layer including an AlN (0001) layer is epitaxially grown on the initial-stage AlN layer by an epitaxial lateral overgrowth method, and stops growing before a recess upper region above the new recesses is completely covered with the first ELO layer that is laterally grown from a protrusion upper surface of the initial-stage AlN layer. A second ELO layer including an $Al_xGa_{1-x}N$ (0001) layer (1>x>0) is epitaxially grown on the first ELO layer by an epitaxial lateral overgrowth method. The recess upper region is completely covered with the second ELO layer that is laterally grown from an upper surface of the first ELO layer.

18 Claims, 15 Drawing Sheets

(56) References Cited

U.S. PATENT DOCUMENTS

2010/0102360 A1* 4/2010 Nakada et al. ............... 257/201
2010/0327228 A1 12/2010 Bando et al.
2012/0258286 A1* 10/2012 Amano et al. ............... 428/162

FOREIGN PATENT DOCUMENTS

| JP | 2005209925 A | 8/2005 |
|---|---|---|
| JP | 2006128527 A | 5/2006 |
| JP | 2006278477 A | 10/2006 |
| JP | 2009184899 A | 8/2009 |
| WO | 2008112097 A3 | 11/2008 |

OTHER PUBLICATIONS

Mei, J. et al.; "Dislocation generation at the coalescence of aluminum nitride lateral epitaxy on shallow-grooved sapphire substrates"; Applied Physics Letters 90, 221909; 2007.

Yan, F. et al.; "Surface smoothing mechanism of AlN film by initially alternating supply of ammonia"; Japanese Journal of Applied Physics, vol. 43, No. 8B; 2004; pp. L1057-L1059.

Paduano, Q. et al.; "Optimized coalescence method for the metalorganic chemical vapor deposition (MOCVD) growth of high quality Al-Polarity AlN films on sapphire"; Japanese Journal of Applied Physics, vol. 44, No. 4; 2005; pp. L150-L152.

* cited by examiner

METHOD OF PRODUCING TEMPLATE FOR EPITAXIAL GROWTH AND NITRIDE SEMICONDUCTOR DEVICE

CROSS-REFERENCE TO RELATED APPLICATIONS

This application is a National Phase filing under 35 U.S.C. §371 of International Application No. PCT/JP2010/059589 filed on Jun. 7, 2010.

TECHNICAL FIELD

The present invention relates to a method for producing a template for epitaxial growth as an underlying substrate where a GaN compound semiconductor layer (general formula: $Al_xGa_yIn_{1-x-y}N$) is epitaxially grown, and also relates to a nitride semiconductor device.

BACKGROUND ART

GaN nitride semiconductor devices such as light-emitting diodes and semiconductor lasers are conventionally produced by growing a multi-layered GaN compound semiconductor layer on a template for epitaxial growth (for example, see Non-patent Document 1). FIG. 15 illustrates a typical crystal layer structure of a conventional GaN light-emitting diode. The light-emitting diode shown in FIG. 15 has a laminated structure. In the structure, after an underlying layer 102 of AlN is formed on a sapphire substrate 101 and then a cyclic groove pattern is formed thereon by photolithography and reactive ion etching, an ELO-AlN layer 103 is formed; plus an n-type clad layer 104 of n-type AlGaN having a thickness of 2 µm, an AlGaN/GaN multi-quantum well active layer 105, a p-type AlGaN electron block layer 106 having a higher Al composition ratio than the multi-quantum well active layer 105 and having a thickness of 20 nm, a p-type clad layer 107 of p-type AlGaN having a thickness of 50 nm, and a p-type GaN contact layer 108 having a thickness of 20 nm are sequentially stacked on the ELO-AlN layer 103. The multi-quantum well active layer 105 has a multi-layered structure including five stacking layers including a GaN well layer of 2 nm in thickness that is sandwiched with AlGaN barrier layers of 8 nm in thickness. After crystal growth, in order to expose a portion of the surface of the n-type clad layer 104, the multi-quantum well active layer 105, the electron block layer 106, the p-type clad layer 107, and the contact layer 108 thereon are etched off. A p-electrode 109 of Ni/Au is formed on the surface of the contact layer 108, for example, and an n-electrode 110 of Ti/Al/Ti/Au is formed on the surface of the exposed n-type clad layer 104, for example. By making a GaN well layer into an AlGaN well layer and changing the Al composition ratio or the thickness of the AlGaN well layer, the emission wavelength is shortened, or by adding In to the layer, the emission wavelength is lengthened, thus providing a light-emitting diode in an ultraviolet region having a wavelength of about 200 nm to 400 nm. Semiconductor lasers may be produced similarly. In the crystal layer structure shown in FIG. 15, a template for epitaxial growth is formed of the sapphire substrate 101, the AlN underlying layer 102, and the ELO-AlN layer 103.

The crystal quality of the template surface directly affects the crystal quality of the GaN compound semiconductor layer formed thereon, providing significant effects on the characteristics of a light-emitting device or the like which is formed as a result. In providing a light-emitting diode or a semiconductor laser in the ultraviolet region, it is particularly desirable to use a template having a reduced threading dislocation density of $10^7/cm^2$ or less or preferably about $10^6/cm^2$. When the ELO-AlN layer 103 is epitaxially grown by an epitaxial lateral overgrowth (ELO) method on the AlN underlying layer 102 having a cyclic groove pattern as shown in FIG. 15, the AlN layer grown from the flat surfaces of the protrusions between the grooves overgrows laterally so as to cover over the grooves, and at the same time, the threading dislocation grown from the flat surfaces concentrates above the grooves due to the lateral overgrowth, so that the threading dislocation density is reduced significantly.

However, for the template including the sapphire substrate, the AlN underlying layer, and the ELO-AlN layer as shown in FIG. 15, it is necessary to remove a sample (substrate) once from a reaction chamber for an epitaxial growth after the AlN underlying layer is grown, and to form a cyclic groove pattern on the surface of the AlN underlying layer by photolithography and reactive ion etching. Thus, the AlN underlying layer and the ELO-AlN layer cannot be grown continuously, and the manufacturing process becomes complex and the throughput decreases, thereby increasing manufacturing costs.

On the other hand, in order to prevent the complication of the manufacturing process and the decrease in throughput by omitting etching between crystal growth processes, proposed are the methods of providing a template for epitaxial growth in which a cyclic groove pattern is directly formed on the surface of the sapphire substrate by photolithography and reactive ion etching or the like, and the ELO-AlN layer is formed directly on the sapphire substrate (for example, see Patent Document 1, and Non-patent Documents 2 and 3). In order to grow an ELO-AlN layer on the grooved surface of a substrate, it is preferable to form deeper grooves on the sapphire substrate surface since the AlN layer grown from the bottom of the grooves needs to be separate from the AlN layer laterally overgrown from the flat surfaces of the protrusions between the grooves. However, the sapphire substrate has a low etching rate and is difficult to process, so that an ELO-AlN layer having a low threading dislocation density needs to be grown on a shallow-grooved substrate.

PRIOR ART DOCUMENTS

Patent Document

Patent Document 1: Japanese Patent No. 3455512

Non-Patent Document

Non-patent Document 1: Kentaro Nagamatsu, et al., "High-efficiency AlGaN-based UV light-emitting diode on laterally overgrown AlN", Journal of Crystal Growth, 310, pp. 2326-2329, 2008

Non-patent Document 2: N. Nagano, et al., "Epitaxial lateral overgrowth of AlN layers on patterned sapphire substrates", phys. stat. sol. (a) 203, No. 7, pp. 1632-1635, 2006

Non-patent Document 3: J. Mei, et al., "Dislocation generation at the coalescence of aluminum nitride lateral epitaxy on shallow-grooved sapphire substrates", Applied Physics Letters 90, 221909, 2007

Non-patent Document 4: F. Yan, et al., "Surface Smoothing Mechanism of AlN Film by Initially Alternating Supply of Ammonia", Japanese Journal of Applied Physics, Vol. 43, No. 8B, 2004, pp. L1057-L1059

Non-patent Document 5: Q. Paduano, et al., "Optimized Coalescence Method for the Metalorganic Chemical Vapor Deposition (MOCVD) Growth of High Quality Al-Polarity AlN Films on Sapphire", Japanese Journal of Applied Physics, Vol. 44, No. 4, 2005, pp. L150-L152

SUMMARY OF THE INVENTION

Problems to be Solved by the Invention

According to Non-patent Document 2, when the ELO-AlN layer is directly grown on the sapphire (0001) substrate surface having grooves in the <10-10> direction, the layer grows laterally and then covers over the grooves at 1,100° C., the general growth temperature of epitaxially overgrowing AlN on the sapphire (0001) substrate, but the grown ELO-AlN has an extremely rough surface. However, at 1,300° C., the surface of the grown ELO-AlN is flat at the atomic level. That is, when the ELO-AlN layer is directly grown on the grooved surface of the sapphire (0001) substrate, the layer needs to be grown under high temperature of 1,300° C. or above. Although Patent Document 1 mentioned above does not disclose a specific AlN growth temperature, the growth temperature is thought to be 1,350° C. or above, or 1,400° C. or above as the layer is grown at an extremely high growth speed (at 1 μm per minute).

As described above, a high temperature treatment of 1,300° C. or above is conventionally required so as to provide a fine and flat ELO-AlN layer surface when an ELO-AlN layer is directly grown on the surface of a sapphire (0001) substrate. However, a heater, used for the heating, wears out much faster at the growth temperature of 1,300° C. or above than at below 1,300° C., and it is also difficult to produce the products in a stable yield. Thus, it is preferable to grow an ELO-AlN layer on the grooved surface of a sapphire (0001) substrate with stability at the growth temperature below 1,300° C.

Also, in a conventional structure as depicted in FIG. 15, the uppermost layer of a template for epitaxial growth is the ELO-AlN layer 103, and an AlGaN nitride semiconductor layer is stacked thereon as a plurality of stacking layers. However, since there is a lattice mismatch between the ELO-AlN layer and the AlGaN layer, it is more preferable if the uppermost layer of the template is an ELO-AlGaN layer in order to further improve the crystal quality of the AlGaN nitride semiconductor layer that is formed on the template. However, throughout extensive research by the present inventors, it is found that GaN decomposes and becomes unstable under the optimum lateral overgrowth condition (high temperature and low pressure) of AlN since GaN has a high nitrogen dissociation pressure, and thus it is difficult to optimize the lateral overgrowth condition of AlGaN.

The present invention is made in consideration of these problems, and an object thereof is to provide a method for producing a template for epitaxial growth and to improve the properties of an AlGaN nitride semiconductor produced by using the template. The template has, at its uppermost surface, an ELO-AlGaN layer that may be grown at a temperature below 1,300° C. on the surface of a sapphire (0001) substrate having recesses and protrusions such as grooves and that has a fine and flat surface.

Means for Solving the Problems

The present inventors found that an ELO-AlN layer or an ELO-AlGaN layer having a fine and flat surface is provided even at a growth temperature below 1,300° C. by first epitaxially growing an initial-stage AlN layer that is controlled to be oriented in the C+-axis direction, in other words, to be C-axis oriented (polar controlled) so as to make Al atoms appear at the outermost surface of growth crystal in a wurtzite crystal structure, on the flat surface of protrusion tops of a sapphire (0001) substrate having recesses and protrusions such as grooves, and then by epitaxially growing an ELO-AlN layer or an ELO-AlGaN layer so as to cover over the recesses by an epitaxial lateral overgrowth method; and that a template for epitaxial growth having a reduced threading dislocation density is provided accordingly. Group III nitride crystals having a wurtzite crystal structure generally grow in the polarity of either group III atoms or nitrogen atoms in respect to the C-axis direction, depending on the type of substrates and the conditions of the initial growth stage. When AlN is grown on the surface of a sapphire (0001) substrate, the polarity of Al needs to be actively controlled. Otherwise, an N polar face may appear on the outermost surface of growth crystal (see, for example, Non-patent Documents 4 and 5 described above).

Furthermore, the present inventors found that a template for epitaxial growth having, as its uppermost layer, an ELO-AlGaN layer with a fine and flat surface is provided by laterally growing—instead of a single ELO-AlGaN layer that cannot be easily grown with optimized conditions—an ELO-AlN layer (first ELO layer) and an ELO-AlGaN layer (second ELO layer) sequentially.

In other words, in order to achieve the above object, the present invention provides a method for producing a template for epitaxial growth, the method including:

processing a surface of a sapphire (0001) substrate to form recesses and protrusions on the surface so that protrusion tops are made flat and have a given plan-view pattern;

epitaxially growing an initial-stage AlN layer on the surface of the sapphire (0001) substrate having the recesses and protrusions by performing C axis orientation control so that a C+ axis oriented AlN layer grows on flat surfaces of the protrusion tops, excluding edges, and that the AlN layer deposited on the recesses obtained by the recesses and protrusions forming process forms new recesses over the recesses;

epitaxially growing a first ELO layer including an AlN (0001) layer, on the initial-stage AlN layer by an epitaxial lateral overgrowth method;

stopping the first ELO layer from growing before a recess upper region above the new recesses is completely covered with the first ELO layer that is laterally grown from a protrusion upper surface of the initial-stage AlN layer, and then epitaxially growing a second ELO layer including an $Al_xGa_{1-x}N$ (0001) layer (1>x>0), on the first ELO layer by an epitaxial lateral overgrowth method; and covering the recess upper region completely with the second ELO layer that is laterally grown from an upper surface of the first ELO layer.

Moreover, according to the method for producing a template for epitaxial growth, having the above-described characteristic, it is preferable that an average length of an opening be 1.5 μm or less, the opening being formed at an upper surface of the recess upper region when the first ELO layer stops growing, the average length of the opening being along a spacing direction of two of the protrusion tops which are adjacent to each other with the recess upper region being interposed therebetween.

Moreover, according to the method for producing a template for epitaxial growth, having the above-described characteristic, it is preferable that the first ELO layer be grown on a protrusion upper surface of the initial-stage AlN layer by at least 1.8 μm.

Moreover, according to the method for producing a template for epitaxial growth, having the above-described characteristic, it is preferable that the initial-stage AlN layer, the first ELO layer, and the second ELO layer be epitaxially grown respectively at a temperature below 1,300° C.

Moreover, according to the method for producing a template for epitaxial growth, having the above-described characteristic, it is preferable that the recesses be formed on the surface of the sapphire (0001) substrate at a depth of 1.0 µm or less.

Moreover, according to the method for producing a template for epitaxial growth, having the above-described characteristic, an AlN layer that is not oriented in C+-axis may be grown near steps formed by the recesses and protrusions during the growth of the initial-stage AlN layer.

Moreover, in order to achieve the above object, the present invention provides a nitride semiconductor device, the device including:

a sapphire (0001) substrate processed to form recesses and protrusions on its surface so that protrusion tops are made flat and have a given plan-view pattern;

an initial-stage AlN layer epitaxially grown on the surface of the sapphire (0001) substrate having the recesses and protrusions;

a first ELO layer including an AlN (0001) layer, epitaxially grown on the initial-stage AlN layer by an epitaxial lateral overgrowth method; and a second ELO layer including an $Al_xGa_{1-x}N$ (0001) layer (1>x>0) that is epitaxially grown on the first ELO layer by an epitaxial lateral overgrowth method, wherein the initial-stage AlN layer is provided so that a C+ axis oriented AlN layer grows on flat surfaces of the protrusion tops, excluding edges, and that the AlN layer deposited on the recesses obtained by the recesses and protrusions forming process forms new recesses over the recesses, and at least a part of an upper surface of a lower layer region is open without being covered with the first ELO layer, but is completely covered with the second ELO layer that is laterally grown from an upper surface of the first ELO layer, the lower layer region being in a recess upper region above the new recess and sandwiched with the first ELO layer laterally grown from protrusion tops of the initial-stage AlN layer.

Moreover, according to the nitride semiconductor device, having the above-described characteristic, it is preferable that an average length of an opening be 1.5 µm or less, the opening being formed at the upper surface of the lower layer region of the recess upper region, the average length of the opening being along a spacing direction of two of the protrusion tops which are adjacent to each other with the recess upper region being interposed therebetween.

Moreover, according to the nitride semiconductor device, having the above-described characteristic, it is preferable that the first ELO layer grown on protrusion upper surfaces of the initial-stage AlN layer, be in a thickness of 1.8 µm or more.

Moreover, according to the nitride semiconductor device, having the above-described characteristic, it is preferable that the recesses formed on the surface of the sapphire (0001) substrate, have a depth of 1.0 µm or less.

Moreover, according to the nitride semiconductor device, having the above-described characteristic, the initial-stage AlN layer includes an AlN layer that is not oriented in C+-axis near steps formed by the recesses and protrusions.

Effects of the Invention

According to the method for producing a template for epitaxial growth or the nitride semiconductor device having the above-described characteristics, provided is an AlGaN layer having a fine and flat surface and a reduced threading dislocation density, that is epitaxially grown on a sapphire (0001) substrate having recesses and protrusions on its surface by an epitaxial lateral overgrowth method at a temperature below 1,300° C., lower than conventional growth temperatures. Specifically, the initial-stage AlN layer, as an underlying layer for the first ELO layer (AlN layer) and the second ELO layer (AlGaN layer) that are sequentially epitaxially grown thereon by an epitaxial lateral overgrowth method, has portions that are epitaxially grown from the flat surfaces of the protrusion tops, and are C+-axis oriented. Specifically, the surface of the initial-stage AlN layer is an Al polar face uniformly. Thus, even at a growth temperature below 1,300° C., a layer having a fine and flat surface and a reduced threading dislocation density can be obtained as the first ELO layer and the second ELO layer that are epitaxially grown thereon by an epitaxial lateral overgrowth method.

Particularly, the lateral overgrowth of the first ELO layer is stopped before the recess upper region is completely covered. The first ELO layer including an AlN layer, with its growth condition being easily optimized, is previously laterally grown and then the second ELO layer starts to laterally grow right before the recess upper region is completely covered by the lateral overgrowth, so that the lateral overgrowth condition of the second ELO layer can be optimized more than in the case where only the second ELO layer is laterally and directly grown on the initial-stage AlN layer. In the lateral overgrowth of the first ELO layer and the second ELO layer, a region (lower layer region of the recess upper region) that is covered from both sides with the first ELO layer, laterally grown from two adjacent protrusion tops sandwiching a new recess of the initial-stage AlN layer is, firstly, formed in a mesa-shape (the cross sectional shape perpendicular to the stretching direction of the recess is trapezoidal) above the new recess. The mesa-shaped upper surface opening gradually narrows as the lateral overgrowth of the first ELO layer progresses. However, the lateral overgrowth of the first ELO layer is stopped before the opening is completely closed with the first ELO layer; then, the lateral overgrowth of the second ELO layer is started; and finally, the second ELO layer laterally grown from the upper surface of the first ELO layer on both sides sandwiching the opening, coalesces over the opening, thereby closing the opening. Closing points of the openings (coalescing points of the second ELO layer) stretch in a ridgeline along the stretching direction of the recesses. Normally, wedge-shaped voids having the ridgeline at the tops are formed at the top portion of the recess upper region. It is conceivable that compressive strain is generated in a lateral direction from both sides near the closing points of the openings and at the upper portions thereof. The properties of the crystal surface under the condition where the compressive strain is generated, heavily depend on surface energy, strains, crystal growth conditions, etc. Therefore, in order to obtain preferable surface properties, growth conditions need to correspond to compressive strains, but it is realized that, by starting the lateral overgrowth of the second ELO layer right before the recess upper region is completely covered, the lateral overgrowth condition of the second ELO layer can be easily optimized. Moreover, since the growth of the first ELO layer can be stopped before the recess upper region is completely covered, the growth condition of the first ELO layer can be set without considering the condition of completely covering the recess upper region, so that an optimized range of the lateral overgrowth condition is wider than in the case where only the first ELO layer is directly and laterally grown from the upper surface of the initial-stage AlN layer and then completely covers over new recesses.

As a result, an AlGaN nitride semiconductor layer of high crystal quality is stably provided as a top layer of the template for the epitaxial growth having the above-described characteristics without increasing manufacturing costs, and thus a semiconductor device having the AlGaN nitride semiconductor layer will have superior performances.

MODE FOR CARRYING OUT THE INVENTION

The following describes embodiments of a method for producing a template for epitaxial growth (hereinafter, sometimes referred to as the "present production process") and a template for epitaxial growth (hereinafter, sometimes referred to as the "present template") included in a nitride semiconductor device according to the present invention with reference to the drawings.

Figure 1A:
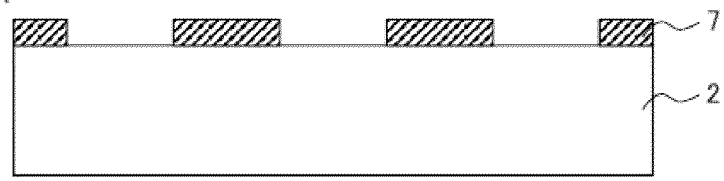
FIGS. 1A, 1B, 1C, 1D and 1E are cross-sectional flow diagrams, each schematically illustrating a flow of a method for producing a template for epitaxial growth according to the present invention.
Figure 1B:
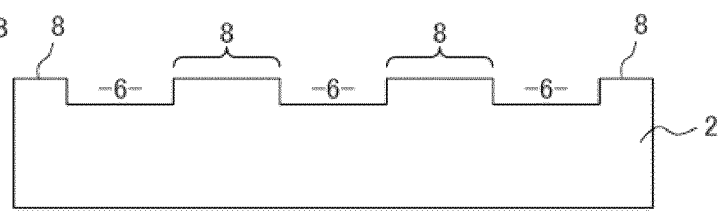
Figure 1C:
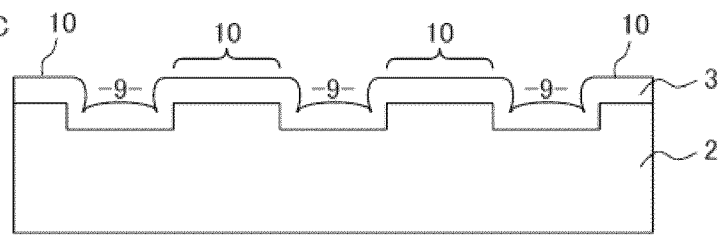
Figure 1D:
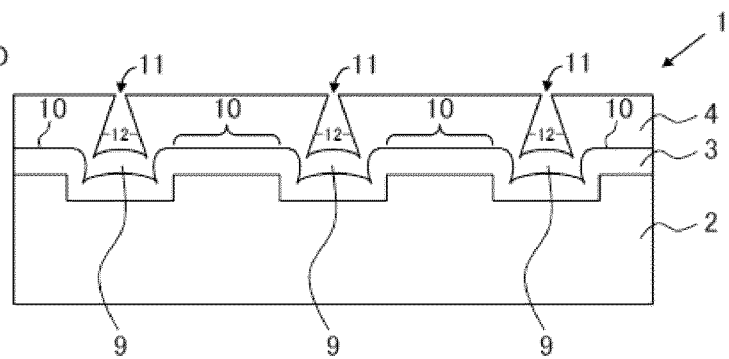
Figure 1E:
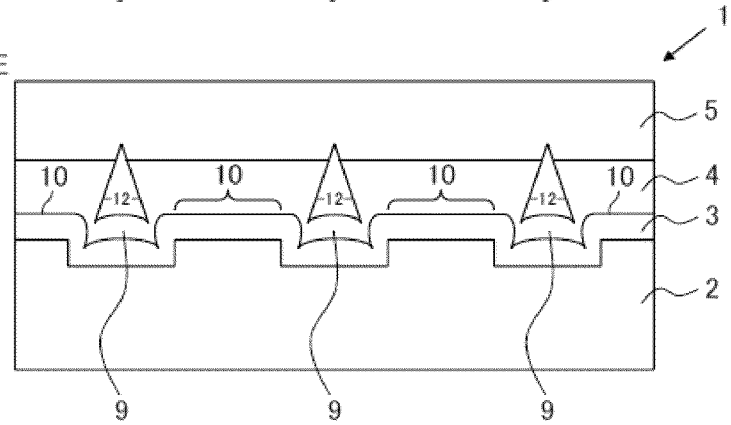

FIGS. 1A, 1B, 1C, 1D and 1E are cross-sectional flow diagrams, each schematically illustrating a flow of the present production method. The figures show cross section structures during and after the process for producing the present template. In FIGS. 1A to 1E, essential parts are exaggerated for the sake of description, and the proportion of parts in the figures is not necessarily actual. As depicted in FIG. 1E, a present template 1 includes a sapphire (0001) substrate 2 processed to form recesses and protrusions on its surface, an initial-stage AlN layer 3 that is epitaxially grown on the surface of the sapphire (0001) substrate having recesses and protrusions, a first ELO layer 4 having an AlN (0001) layer that is epitaxially grown on the initial-stage AlN layer 3 by an epitaxial lateral overgrowth method, and a second ELO layer 5 having an $Al_xGa_{1-x}N$ (0001) layer (wherein 1>x>0) that is epitaxially grown on the first ELO layer 4 by an epitaxial lateral overgrowth method. The method for producing the present template 1 according to one embodiment will be described below in detail with reference to FIGS. 1A to 1E. For the following description, recesses and protrusions on the surface of the substrate 2 are formed of a plurality of grooves 6 extending in the <11-20> direction, and the grooves 6 are recessed inside and intervals between the grooves 6 protrude.

First, the sapphire (0001) substrate 2 is prepared, and an Ni mask 7 which is patterned in a stripe shape is formed on the substrate (see FIG. 1A). Then, the substrate surface is etched by a conventional anisotropic etching method such as reactive ion etching (RIE), thereby forming a plurality of grooves 6 extending in the <11-20> direction (see FIG. 1B). A protrusion top 8 between the grooves 6 is a flat (0001) crystal face. In this embodiment, the groove 6 is preferably about 0.3 μm to 1.0 μm in depth, about 1.0 μm to 5.0 μm in width, and about 1.0 μm to 5.0 μm in intervals between the grooves. Moreover, although the plan-view pattern of the grooves is assumed to be stripes in the embodiment, the plan-view pattern of the protrusion tops 8 between the grooves may be in equilateral triangle, regular hexagon, and diamond shapes, in addition to the stripe pattern, as there are three directions that are equivalent to the <11-20> directions.

The sapphire substrate 2 having recesses and protrusions on its surface is put inside a conventional metalorganic vapor phase epitaxy (MOVPE) reaction chamber (not shown), and the initial-stage AlN layer 3 is epitaxially grown on the sapphire substrate 2 by the MOVPE method (see FIG. 1C). The initial-stage AlN layer 3 has a thickness of about 0.2 μm to 1.5 μm. As long as new recesses 9 (second recesses 9) are formed along the grooves 6 formed on the substrate 2 even after the deposition of the initial-stage AlN layer 3, the initial-stage AlN layer 3 may be thinner or thicker than the depth of the grooves 6. The initial-stage AlN layer 3 is uniformly oriented in the C+ axis at the surface of a growth film as the growth progresses. Once the layer is oriented in the C+ axis, uniform C+ axis orientation will be maintained afterwards, so that there is no need to let the initial-stage AlN layer 3 grow further.

The growth temperature of the initial-stage AlN layer 3 is below 1,300° C., and is set higher (for example, at 1,250° C.) than the epitaxial growth temperature of a general AlGaN layer (1,100° C. to 1,200° C., the crystallization temperature or higher). The pressure is set at about 50 Torr or less (for example, at about 25 Torr). In this embodiment, the initial-stage AlN layer 3 is subjected to the C-axis orientation control (polarity control) so as to orient the film grown from the protrusion tops 8 of the sapphire substrate 2 into the C+-axis;

in other words, to provide an Al polar face at the surface (protrusion surfaces 10) of the film. The C-axis orientation control described above is carried out by adjusting the flow ratio ($NH_3$/TMA) between TMA (trimethylaluminum) and $NH_3$ (ammonia) as the materials (precursors) of Al and N under the above-described temperature and pressure conditions. In this embodiment, as for the conditions of the C-axis orientation control, as described above, the pressure is set relatively low (at about 50 Torr or below) for growing an AlN layer for a template; the growth speed of the layer is set slower than the speed of epitaxially growing the first ELO layer 4 by an epitaxial lateral overgrowth method on the initial-stage AlN layer 3; and the flow ratio is set at, for example, 148.

For the initial-stage AlN layer 3, it is sufficient as long as the face (protrusion surfaces 10) of the growth film that is grown from the protrusion tops 8 is Al polar face. It is unnecessary to orient the growth film that is grown from the bottoms of the recesses in the grooves 6, into the C+-axis. Moreover, the AlN layer grown from the side walls of the recesses in the grooves 6 is not oriented into the C+-axis, and has a semi-polar or non-polar face. Thus, since the edges on the protrusion surfaces 10 have the film grown from the side walls of the recesses in the grooves 6, the edges are not Al polar face. Only the protrusion surfaces 10 (except for the edges) need to be Al polar face, which means that the first ELO layer 4 that is epitaxially grown on the initial-stage AlN layer 3 by an epitaxial lateral overgrowth method, covers over second recesses 9 from the sides with the film laterally grown from the protrusion surfaces 10 and gradually narrows openings above the second recesses 9, prohibiting the film growth from the bottoms of the second recesses 9 and eventually stopping the film growth from the bottoms. Thus, it is necessary to consider only the influence on the film grown from the protrusion surfaces 10.

Subsequently, the first ELO layer 4 is grown by a conventional lateral overgrowth method on the initial-stage AlN layer 3 having a surface with a recessed-and-protruded structure (the second recesses 9 and protrusion surfaces 10) along the grooves 6 formed on the sapphire substrate 2 (see FIG. 1D). Like the initial-stage AlN layer 3, the first ELO layer 4 is epitaxially grown by the MOVPE method. As for the initial-stage AlN layer 3, the growth temperature of the first ELO layer 4 is below 1,300° C., and is set higher (for example, at 1,230° C.) than the epitaxial growth temperature of a general AlGaN layer (1,100° C. to 1,200° C., the crystallization temperature or higher). As one example, growth temperature and pressure condition are roughly the same as those for the initial-stage AlN layer 3, and the initial-stage AlN layer 3 and the first ELO layer 4 may be sequentially grown in the same reaction chamber. Under the temperature and pressure conditions described above, the flow ratio between TMA and $NH_3$ ($NH_3$/TMA) is adjusted herein, so as to allow the first ELO layer 4 that is laterally grown from the protrusion surfaces 10 on both sides of the second recesses 9, to approach above the second recesses 9 within a given range of growth film thickness in the C-axis direction (for example, about 1.5 µm to 3 µm). Normally, if the temperature and pressure conditions are the same as those during the process of growing the initial-stage AlN layer 3, the flow ratio ($NH_3$/TMA) is set smaller than (about half as much as) that during the process of growing the initial-stage AlN layer 3. When the grooves 6 are assumed to be 2 µm or wider, the first ELO layer 4 is prevented from growing when the average length of openings 11 sandwiched with the film laterally grown from both sides of the second recesses 9 is about 1.5 µm or shorter before the film that is laterally grown from the both sides of the second recesses 9 coalesces above the second recesses 9. The length of the openings 11 is perpendicular to the stretching direction of the grooves 6. It is the length in a parallel direction to the surface of the sapphire substrate 2 (width direction of the grooves 6), and is not necessarily constant depending on the position of a cross section perpendicular to the stretching direction of the grooves 6, or among different grooves 6. As an example, the average length of openings is provided by measuring an area at a given unit length (for example, about 20 µm to 100 µm) along the stretching direction of the grooves 6 of the openings 11 at the upper surface of the first ELO layer 4, and then dividing it by the unit length. The method for measuring the average length of openings is not limited to the method described above.

For the sake of convenience, the upper region of the second recesses 9 will be referred to as "recess upper region", and the region that is in the "recess upper region" and sandwiched with the first ELO layer 4 laterally grown from the protrusion surfaces 10 on both sides of the second recesses 9 will be referred to as "lower layer region 12 in the recess upper region" below. Additionally, during the process of growing the first ELO layer 4, at least a portion inside the lower layer region 12 in the recess upper region is filled with the AlN that grew from the bottoms of the second recesses 9.

Figure 7A:
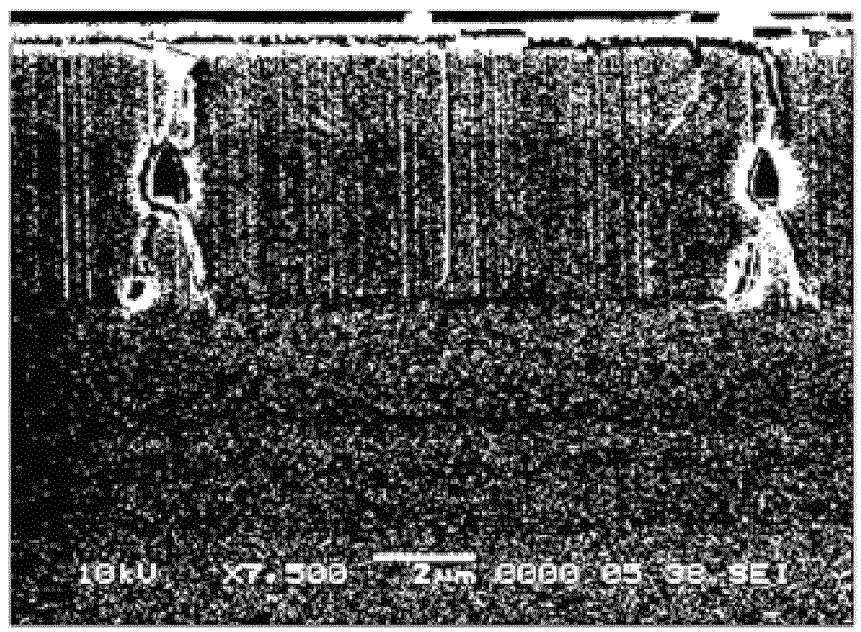
FIGS. 7A and 7B are SEM images (cross-sectional view and bird's-eye view), showing Example 3 of the template for epitaxial growth according to the present invention.

Subsequently, the second ELO layer 5 is grown on the first ELO layer 4 by a conventional lateral overgrowth method (see FIG. 1E). Similar to the initial-stage AlN layer 3 and the first ELO layer 4, the second ELO layer 5 is epitaxially grown by the MOVPE method. As for the initial-stage AlN layer 3 and the first ELO layer 4, the growth temperature of the second ELO layer 5 is below 1,300° C., and is set lower than (for example, at 1,180° C.) the growth temperature of the initial-stage AlN layer 3 and the first ELO layer 4. The initial-stage AlN layer 3, the first ELO layer 4, and the second ELO layer 5 may be sequentially grown in the same reaction chamber. Under the temperature and pressure conditions described above, the flow ratio ($NH_3$/MO) between the organic metal (MO) of TMG (trimethylgallium) as a raw material (precursor) of TMA and Ga, and $NH_3$ is adjusted herein, so as to allow the second ELO layer 5 that is laterally grown from the upper surfaces of the first ELO layer 4 on both sides of the second recesses 9, to coalesce above the second recesses 9 within a given range of growth film thickness (for example, about 1 µm to 6 µm) in the C-axis direction. Normally, the flow ratio ($NH_3$/MO) is set higher (for example, by about 4 to 20 times) than the flow ratio ($NH_3$/TMA) of the initial-stage AlN layer 3 and the first ELO layer 4. Additionally, as shown in FIG. 1E, wedge-shaped voids are normally formed at the top portions of the recess upper regions that are closed with the second ELO layer 5 (see FIGS. 2, 7, and 8). The flow ratio ($NH_3$/MO) of the second ELO layer 5 is in a wider acceptable range than that of the first ELO layer 4 since the recess upper regions have already been covered with the first ELO layer 4 to the extent that the average length of the openings 11 reaches about 1.5 µm, and the flow ratio is adjusted based on an Al molar fraction (Al composition ratio) x of an $Al_xGa_{1-x}N$ (0001) layer.

Figure 6A:
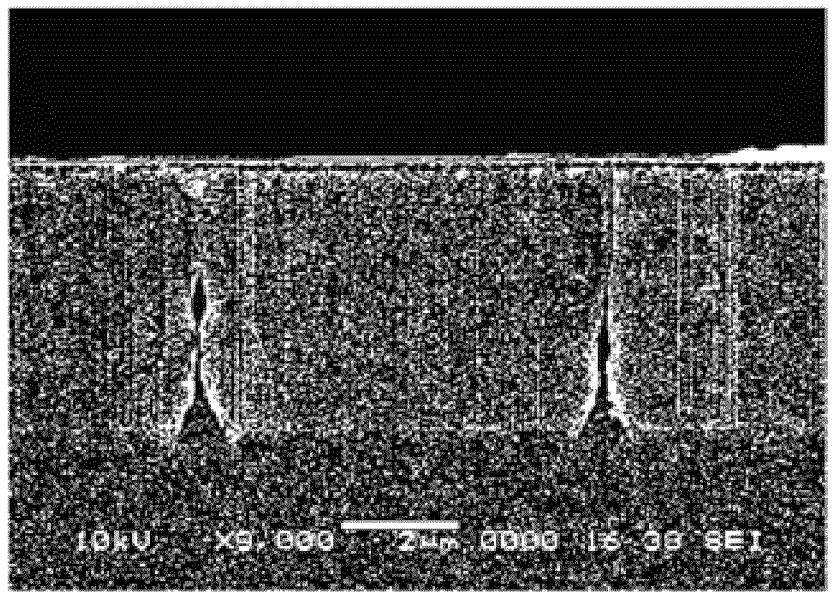
FIGS. 6A and 6B are SEM images (cross-sectional view and bird's-eye view), showing Example 2 of the template for epitaxial growth according to the present invention.
Figure 6B:
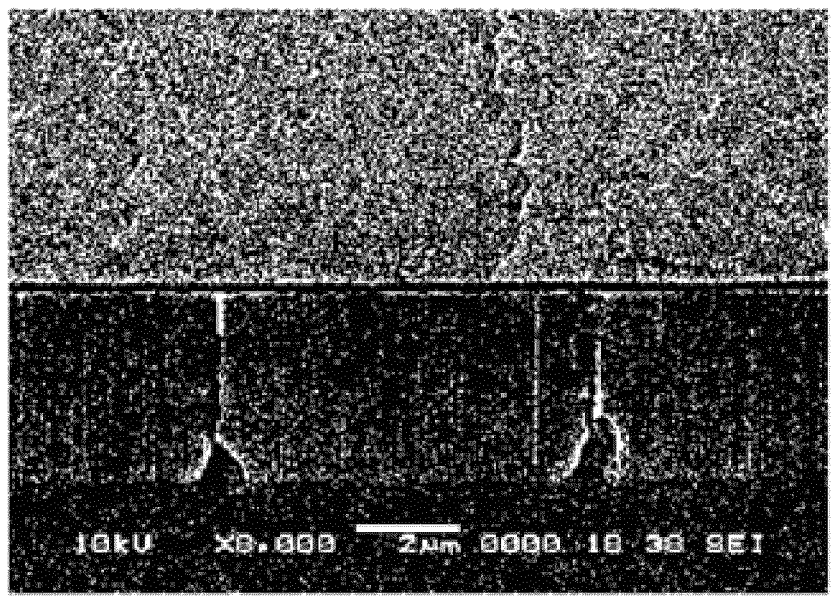

The wedge-shaped voids may not be necessarily formed over the entire region of the top portion of the recess upper region. For example, as depicted in the SEM images (see FIGS. 6A and 6B) of Example 2 described below, there is a case in which the wedge-shaped voids are filled with the AlN grown from the bottoms of the second recesses 9 and the slits of imperfectly coalesced second ELO layer 5 may be formed above the vertexes of the wedge-shaped voids. In this case, the second ELO layer 5 is completely coalesced at the uppermost ends of the slits, and the top portions of the recess upper regions are completely covered. Moreover, regarding the shape of the openings 11 when the lateral overgrowth of the first ELO layer 4 is stopped, ridges on both sides of the openings 11 that extend along the stretching direction of the grooves 6 are not in two parallel straight lines as shown in the differential interference microscopic image (see FIG. 12) of Example 6 described below, showing the state where the recess upper regions are not completely covered after the first ELO layer 4 is formed. In other words, the lengths of the openings 11, as described above, are not necessarily constant based on the position of a cross section that is perpendicular to the stretching direction of the grooves 6 or among the different grooves 6. Therefore, depending on the position of a cross section, the length of the opening 11 may be nearly zero when the lateral overgrowth of the first ELO layer 4 is stopped; or at a different location, the opening length may be about 1.5 μm or longer. It is preferable that the average length be about 1.5 μm or shorter. Moreover, the opening length may be shorter when the growth of the second ELO layer 5 is completed than when the lateral overgrowth of the first ELO layer 4 is stopped, due to lateral compressive stress added to the second ELO layer 5. Accordingly, when the growth of the second ELO layer 5 is completed, a boundary surface between the first ELO layer 4 and the second ELO layer 5 may be positioned higher, depending on a position of the cross section, than the apparent vertexes of the wedge-shaped voids.

As described above, a recessed-and-protruded structure is formed on the sapphire substrate 2, and the initial-stage AlN layer 3, the first ELO layer 4, and the second ELO layer 5 are sequentially grown, thus providing a template for epitaxial growth (the present template 1) having a fine and flat surface and an AlGaN layer as its uppermost layer and also with a reduced threading dislocation density.

The drawings are referred to hereinafter so as to describe the examples (Examples 1 to 6) and partial example of the present template 1 produced by the above-described present production method, and the comparative examples (Comparative Examples 1 to 2) and the partial comparative example produced without depending on the present production method. Examples 1 to 6 were provided as described above by the present production method, and the top portions of the recess upper regions are neatly closed with the second ELO layer 5 in these examples. Comparative Example 1 is a sample in which no initial-stage AlN layer 3 was provided and the first ELO layer 4 and the second ELO layer 5 were grown under the same conditions as in Example 1 on the sapphire substrate 2 formed thereon with a recessed-and-protruded structure. Comparative Example 2 is a sample in which the first ELO layer 4 was grown until the recess upper region was completely covered and an AlGaN layer was grown thereon under a general epitaxial overgrowth condition.

Furthermore, as reference examples, provided are the partial example wherein the sapphire substrate 2 and the C+-axis oriented initial-stage AlN layer 3 included in the present template 1 were produced by the present production method, and the partial comparative example wherein the C-axis oriented initial-stage AlN layer 3 was grown on the sapphire substrate 2. Comparative Example 1 is to test if there is any difference with or without the initial-stage AlN layer 3, and the partial comparative example is to test a difference that results from different polarities of the C-axis orientation control of the initial-stage AlN layer 3, at the step of growing the initial-stage AlN layer. Comparative Example 2 is to test if there is any difference with or without stopping the lateral overgrowth of the first ELO layer 4 before the layer coalesces above the second recesses 9.

In the SEM images shown in the description below, a direction perpendicular to the image (cross section) is the <11-20> direction that is the stretching direction of the grooves 6; and a direction parallel to the image (cross section) and the surface of the sapphire substrate 2 is the <1-100> direction of the sapphire substrate 2. Moreover, the gradation of the SEM images is binarized for an international application, so that the images are less clear than actual photographic images. Furthermore, the measured film thicknesses in each example and comparative example are approximate values, and have measurement errors of about 0.3 μm or less.

Example 1 and Comparative Example 1

Figure 2A:
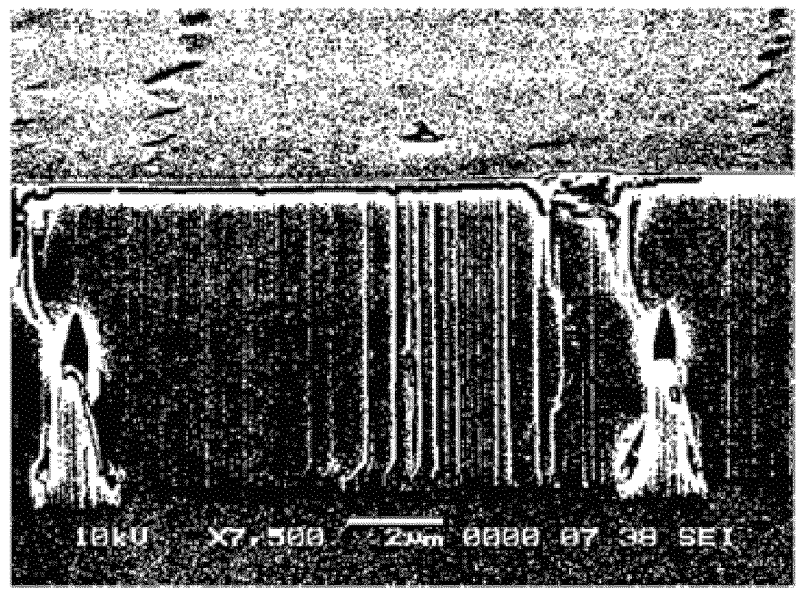
FIGS. 2A and 2B are SEM images (bird's-eye views), showing a state after a second ELO layer in Example 1 of the template for epitaxial growth according to the present invention was grown by an epitaxial lateral overgrowth method and a state after the second ELO layer was etched with KOH alkaline solution.
Figure 2B:
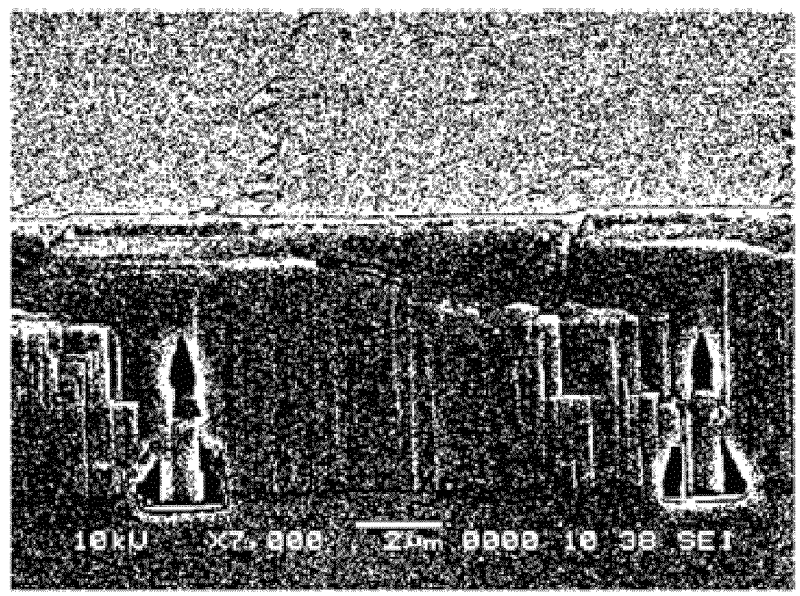
Figure 3A:
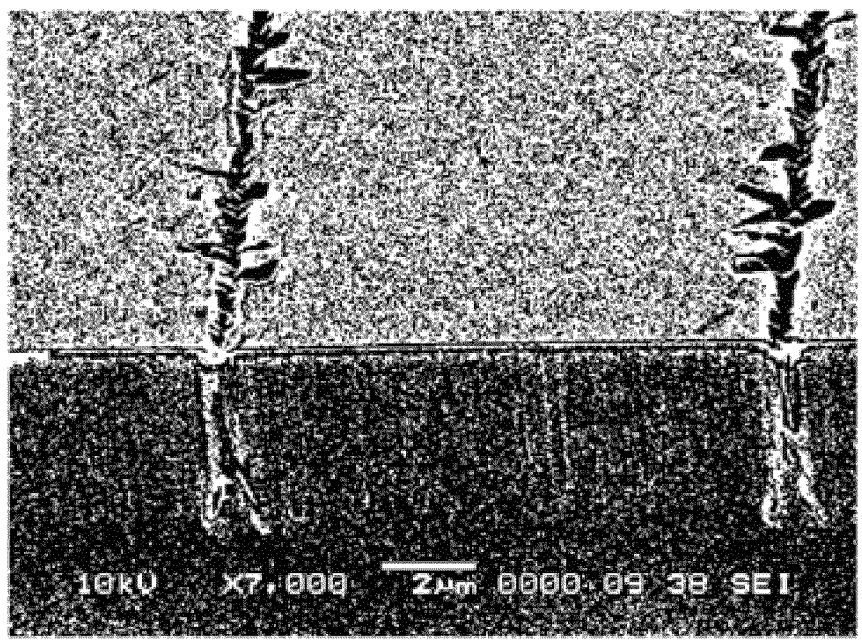
FIGS. 3A and 3B are SEM images (bird's-eye views), showing a state after a second ELO layer of a template for epitaxial growth of Comparative Example 1 was grown by an epitaxial lateral overgrowth method and a state after the second ELO layer was etched with KOH alkaline solution.
Figure 3B:
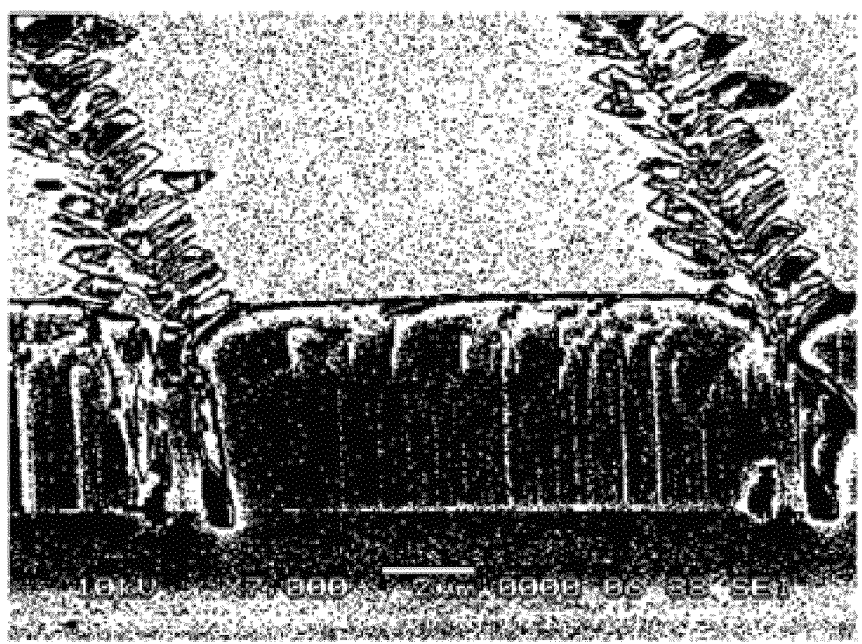
Figure 4A:
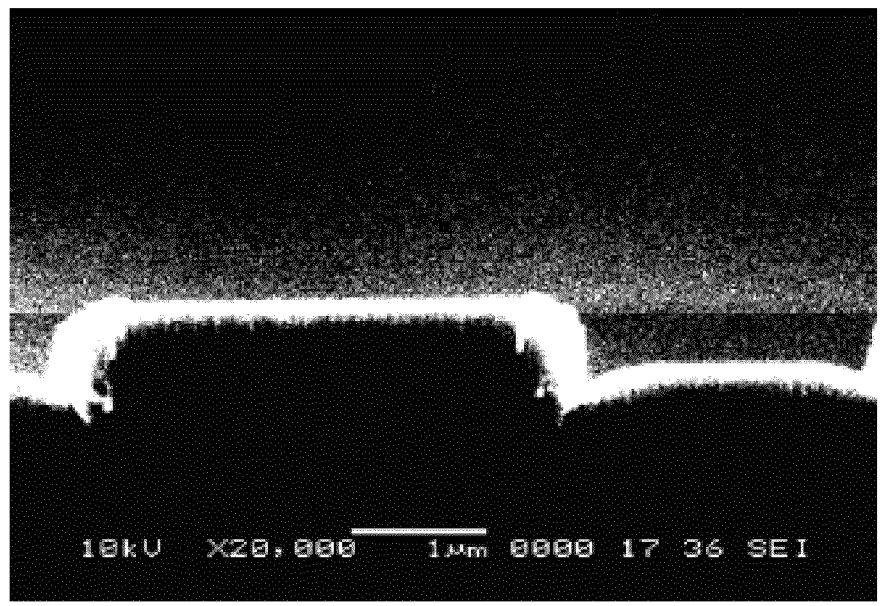
FIGS. 4A and 4B are SEM images (cross-sectional view and bird's-eye view), showing a partial example of the template for epitaxial growth according to the present invention.
Figure 4B:
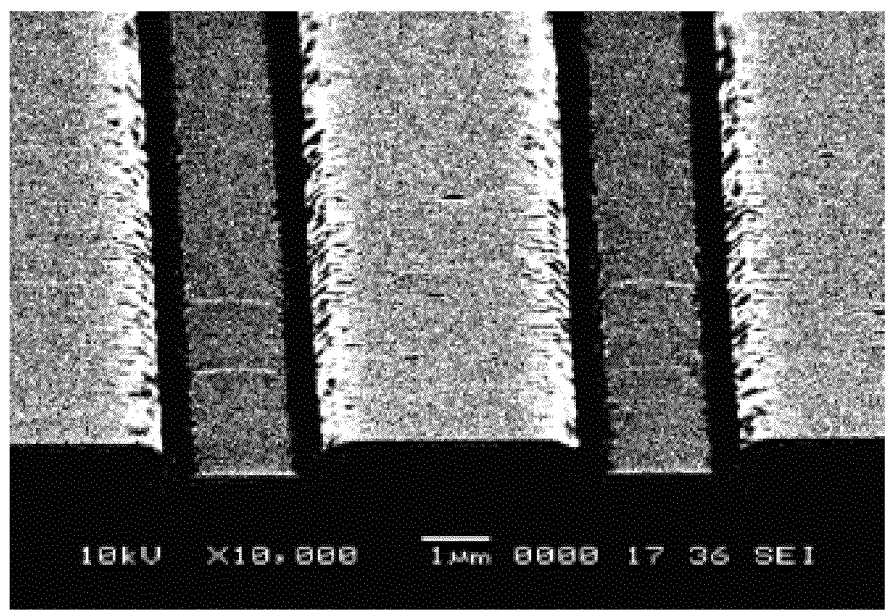
Figure 5A:
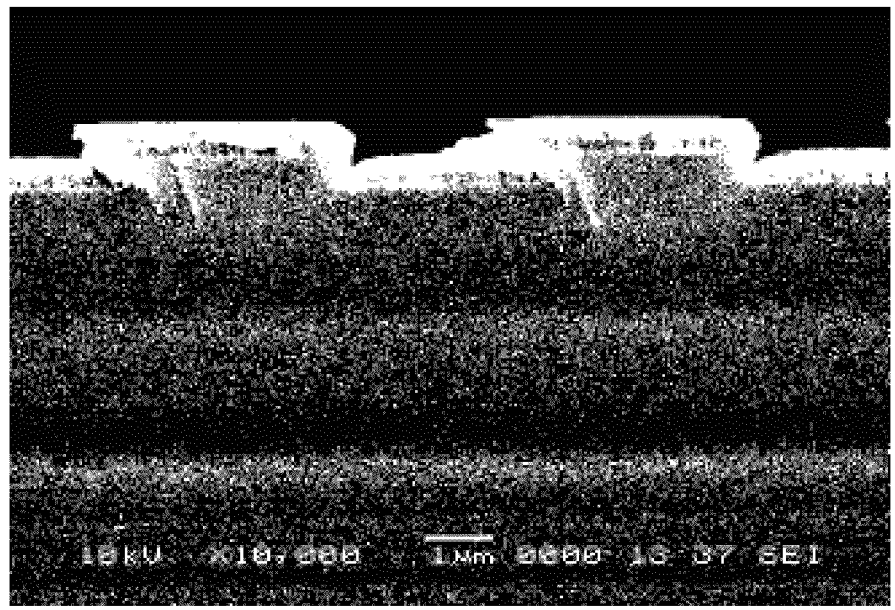
FIGS. 5A and 5B are SEM images (cross-sectional view and bird's-eye view), showing a partial comparative example of the template for epitaxial growth.
Figure 5B:
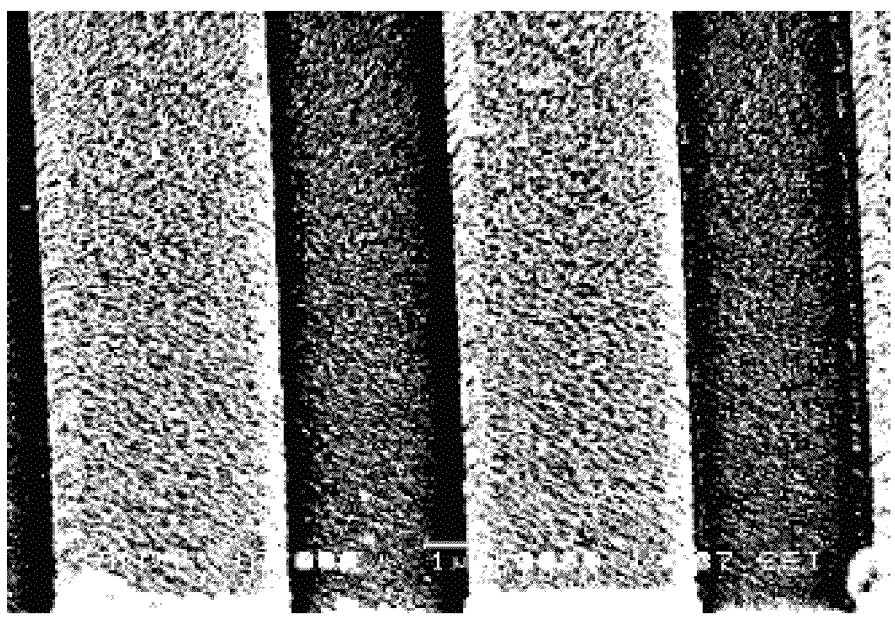

FIGS. 2A and 2B and FIGS. 3A and 3B show the SEM images of Example 1 and Comparative Example 1. FIGS. 2A and 2B are bird's-eye views of the state after the second ELO layer 5 in Example 1 was formed (FIG. 2A) and also the state after the second ELO layer 5 was etched with KOH alkaline solution (FIG. 2B). FIGS. 3A and 3B are bird's-eye views of the state after the second ELO layer 5 in Comparative Example 1 was formed (FIG. 3A) and also the state after the second ELO layer 5 was etched with KOH alkaline solution (FIG. 3B). The growth conditions of the first ELO layer 4 and the second ELO layer 5 are the same in Example 1 as in Comparative Example 1, except that the initial-stage AlN layer 3 is formed in one example and is not in the other. The sapphire substrate 2 of Example 1 has the same recessed-and-protruded structure as the sapphire substrate 2 of Comparative Example 1, and the width, interval (width of the protrusion tops 8), and depth of the grooves 6 formed on the surface of the sapphire substrate 2 are 2 μm, 10 μm, and 0.3 μm, respectively. The initial-stage AlN layer 3 of Example 1 is in the thickness of 1.8 μm. The first ELO layer 4 and the second ELO layer 5 of Example 1 and Comparative Example 1 are in the thickness of 1.8 μm and 2.3 μm, respectively. The Al molar fraction x of the second ELO layer 5 of Example 1 and Comparative Example 1 is 0.9, respectively. In Example 1, the formation of wedge-shaped voids is detected at the cross section of the SEM images in FIGS. 2A and 2B, and the height from the protrusion top 8 of the sapphire substrate 2 to the top of the wedge-shaped voids (hereinafter, referred to as "void height" for convenience) is 4.0 μm in case of the voids shown in the SEM images. The height is larger than the total layer thickness (3.6 μm) of the initial-stage AlN layer 3 and the first ELO layer 4. Additionally, the void depth is measured with the eye based on the SEM images.

In comparing Example 1 of FIG. 2A to Comparative Example 1 of FIG. 3A, it is found that there is clearly a difference in crystal surface roughness after the second ELO layer 5 is formed. While the second ELO layer 5 is completely coalesced at the recess upper region in Example 1, the coalescence of the second ELO layer 5 is incomplete in the comparative example, so that it is found that the surface of the second ELO layer 5 is finer and more flat in Example 1 than in Comparative Example 1. Furthermore, the etching speed with KOH alkaline solution is different between the C+-axis oriented Al polar face and the C-axis oriented N polar face, and it is easier to etch an N polar face, so that it is possible to visually recognize the orientation of the second ELO layer 5 after the film formation by etching it with KOH alkaline solution. In comparing Example 1 to Comparative Example 1 after the etching treatment as depicted in FIGS. 2B and 3B, as the second ELO layer 5 of Example 1 is formed on the C+-axis oriented initial-stage AlN layer 3 through the first ELO layer 4, uniform C+-axis orientation is similarly recognizable. On the contrary, since there is no initial-stage AlN layer 3 subjected to C+-axis orientation control in Comparative Example 1, the C-axis orientation of the first ELO layer 4 grown on the sapphire substrate 2 has mixed polarities. In other words, both the Al polar face and N polar face appear for layer formation; as a result, it is realized that, as the upper layer, the second ELO layer 5 is also grown with both the Al polar face and N polar face. Based on the above-described comparative results between Example 1 and Comparative Example 1, it is clear that the second ELO layer 5 having a fine and flat surface can be obtained by providing the C+-axis oriented initial-stage AlN layer 3.

Partial Example and Partial Comparative Example

FIGS. 4A and 4B and FIGS. 5A and 5B show the SEM images (cross-sectional views (A) and bird's-eye views (B)) of a partial example and a partial comparative example. In the partial example and the partial comparative example, the grooves 6 formed on the surface of the sapphire substrate 2 have a width and an interval of 3 μm respectively, and a depth of 0.5 μm. The initial-stage AlN layer 3 of the partial example is in the thickness of 0.7 μm, and the C-axis oriented initial-stage AlN layer of the partial comparative example is in the thickness of 0.5 μm. The C-axis oriented initial-stage AlN layer of the partial comparative example is grown under the same temperature and pressure as in the partial example, and the flow ratio ($NH_3$/TMA) is different from that in the partial example. The flow ratio ($NH_3$/TMA) is 148 in the partial example, but is set high at 1,154 in the partial comparative example.

In comparing FIGS. 4A and 4B to FIGS. 5A and 5B, after the film formation of the initial-stage AlN layer 3, it is found that there is already a difference in surface roughness of the films grown from the protrusion tops 8 (the protrusion surfaces 10). It is found that the protrusion surfaces 10 are finer in the partial example than that in the partial comparative example. Based on the above-described comparative results between Example 1 and Comparative Example 1 and also between the partial example and the partial comparative example, it is further clear that the second ELO layer having a fine and flat surface can be obtained by providing the C+-axis oriented initial-stage AlN layer 3.

Examples 2 to 4

FIGS. 6A and 6B, FIGS. 7A and 7B, and FIGS. 8A and 8B show the SEM images (cross-sectional views (A) and bird's-eye views (B)) of Examples 2 to 4 in sequence. In Example 2, the width, interval, and depth of the grooves 6 formed on the surface of the sapphire substrate 2 are 2 μm, 5 μm, and 0.3 μm, respectively; in Example 3, the width, interval, and depth are 2 μm, 10 μm, and 0.3 μm, respectively; and in Example 4, the width, interval, and, depth are 3 μm, 5 μm, and 0.3 μm, respectively, so that the sapphire substrates 2 have different recessed-and-protruded structures thereon. In Examples 2 to 4, the growth conditions (growth temperature and flow ratio) of the initial-stage AlN layer 3, the first ELO layer 4, and the second ELO layer 5 are set to be the same, respectively. The thicknesses of the initial-stage AlN layer 3, the first ELO layer 4, and the second ELO layer 5 are 1.5 μm, 1.8 μm, and 1.8 μm, respectively, in Example 2; the thicknesses are 1.5 μm, 1.8 μm, and 2.3 μm, respectively, in Example 3; and the thicknesses are 2.0 μm, 2.1 μm, and 6.3 μm, respectively, in Example 4. The Al molar fractions x of the second ELO layer 5 are 0.87 in Example 2, 0.9 in Example 3, and 0.75 in Example 4. Also in Examples 2 to 4, the formation of wedge-shaped voids is seen in the cross section of each SEM image of FIGS. 6A and 6B, FIGS. 7A and 7B, and FIGS. 8A and 8B. The void heights are 2.8 nm in Example 2, 3.0 μm in Example 3, and 4.2 μm in Example 4, respectively. In Examples 2 and 3, void heights at the cross sections (2.8 nm, 3.0 μm) are slightly shorter (by 0.5 μm, 0.3 μm) than the total layer thickness (3.3 μm in each example) of the initial-stage AlN layer 3 and the first ELO layer 4. However, when the lateral overgrowth of the first ELO layer 4 is stopped, there is the opening 11 as seen from a recess upper region as a whole, and the recess upper region is not completely covered with the first ELO layer 4.

In FIGS. 6A and 6B, FIGS. 7A and 7B, and FIGS. 8A and 8B, although the sapphire substrates 2 have different recessed-and-protruded structures (widths and intervals of the grooves 6) in the surfaces thereof, each example has the C+-axis oriented initial-stage AlN layer 3, thus providing a fine and flat surface for the second ELO layer 5, which is formed thereon as the uppermost layer.

Example 3 and Comparative Example 2

Figure 9A:
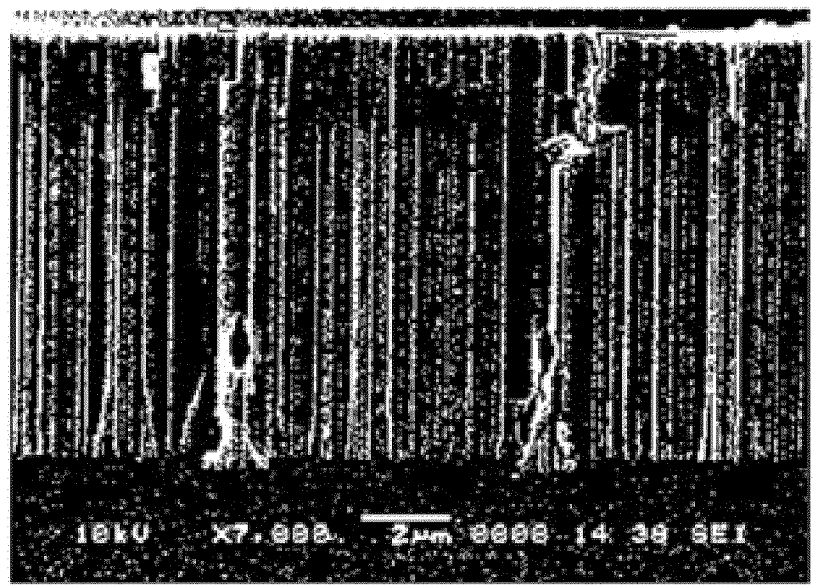
FIGS. 9A and 9B are SEM images (cross-sectional view and bird's-eye view), showing Comparative Example 2 of the template for epitaxial growth.
Figure 9B:
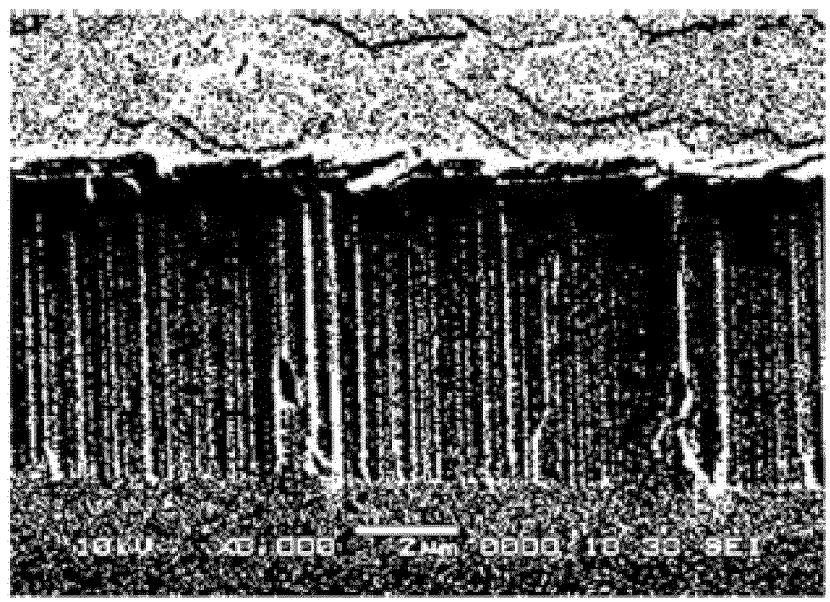

FIGS. 9A and 9B show the SEM images (cross-sectional view (A) and bird's-eye view (B)) of Comparative Example 2. The recessed-and-protruded structure on the sapphire substrate 2, and the growth conditions (growth temperature and flow ratio) and the thickness of the initial-stage AlN layer 3 in Comparative Example 2 are the same as those in Example 3. In Comparative Example 2, the growth temperature of the first ELO layer 4 is 1,250° C.; the flow ratio ($NH_3$/TMA) is the same as that in Example 3; and the layer thickness is 7.5 μm. As described above, the first ELO layer 4 is thicker than those in Examples 1 to 4, so that the layer grows until the recess upper region is completely covered therewith. The growth condition of the AlGaN layer in Comparative Example 2 is roughly the same as the growth condition of the second ELO layer 5 in Examples 1 to 4, and the thickness thereof is 1.3 μm. The Al molar fraction x of the AlGaN layer in Comparative Example 2 is 0.82.

Figure 10:
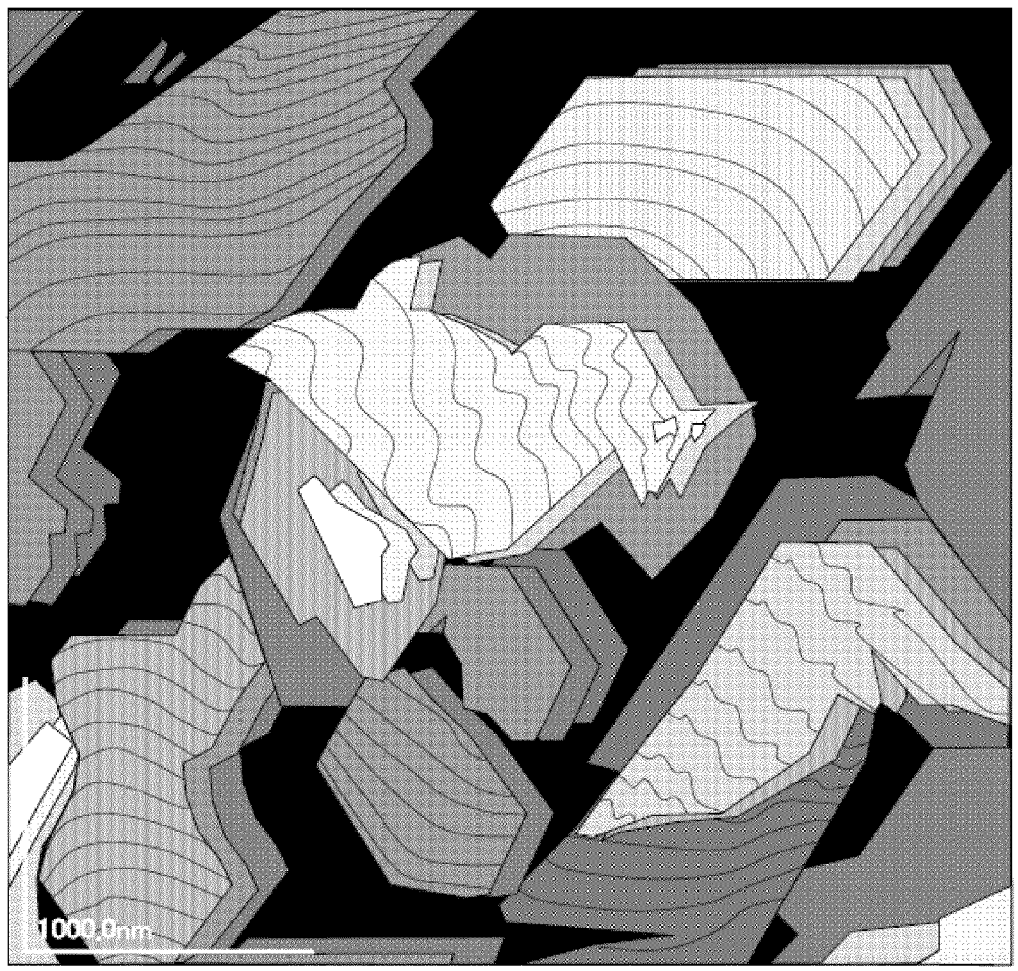
FIG. 10 is an atomic force microscopic image of the crystal surfaces of Example 3 of the template for epitaxial growth and of Comparative Example 2 of the template for epitaxial growth according to the present invention.

For Example 3 and Comparative Example 2, the crystal surfaces after the formation of the second ELO layer 5 were observed with an atomic force microscope (AFM), and the surface properties were compared. FIG. 10 schematically shows the contrast of the AFM image on the crystal surface of the AlGaN layer in Comparative Example 2. If the gradation of the AFM image is binarized for an international application, the image loses its characteristics. Thus, the surface properties of the second ELO layer 5 in Comparative Example 2 will be described by referring to the schematic diagram.

Figure 7B:
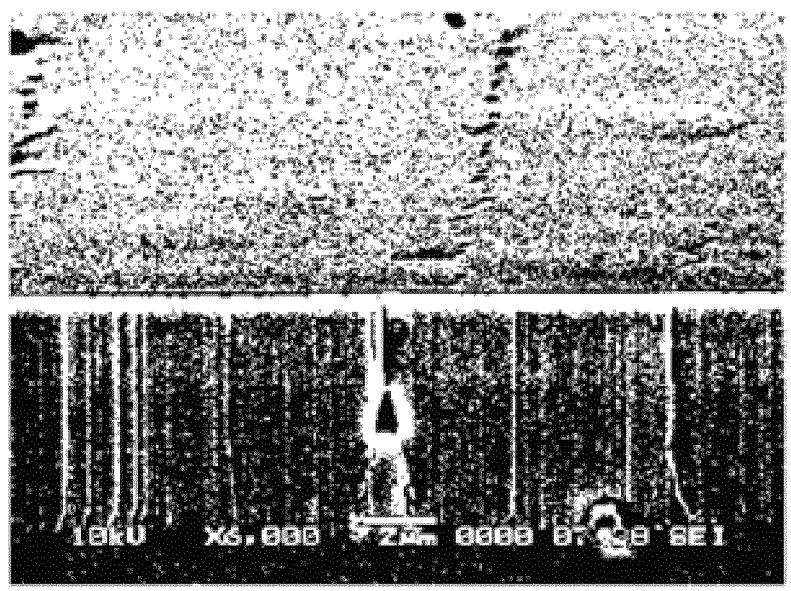
Figure 8A:
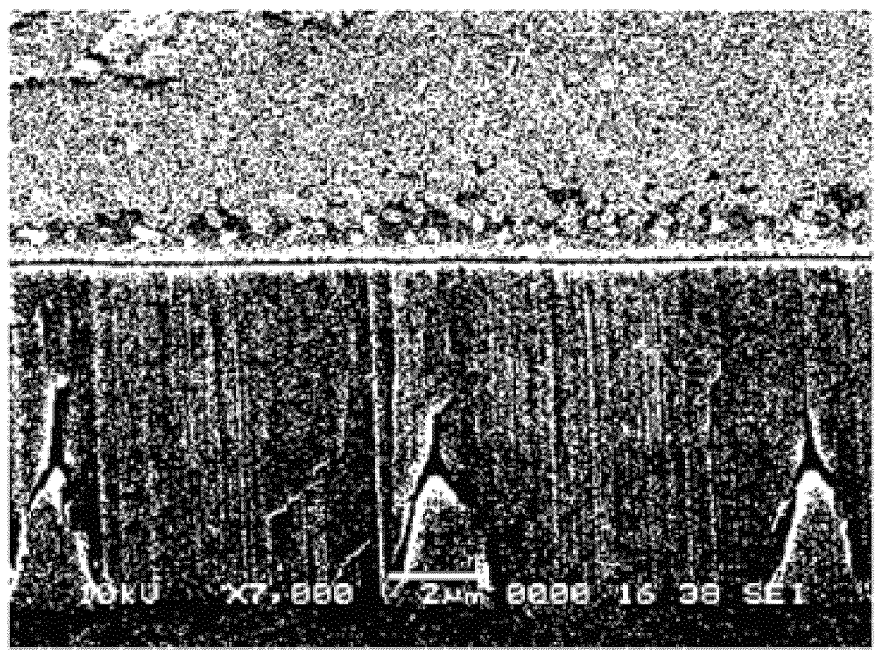
FIGS. 8A and 8B are SEM images (cross-sectional view and bird's-eye view), showing Example 4 of the template for epitaxial growth according to the present invention.
Figure 8B:
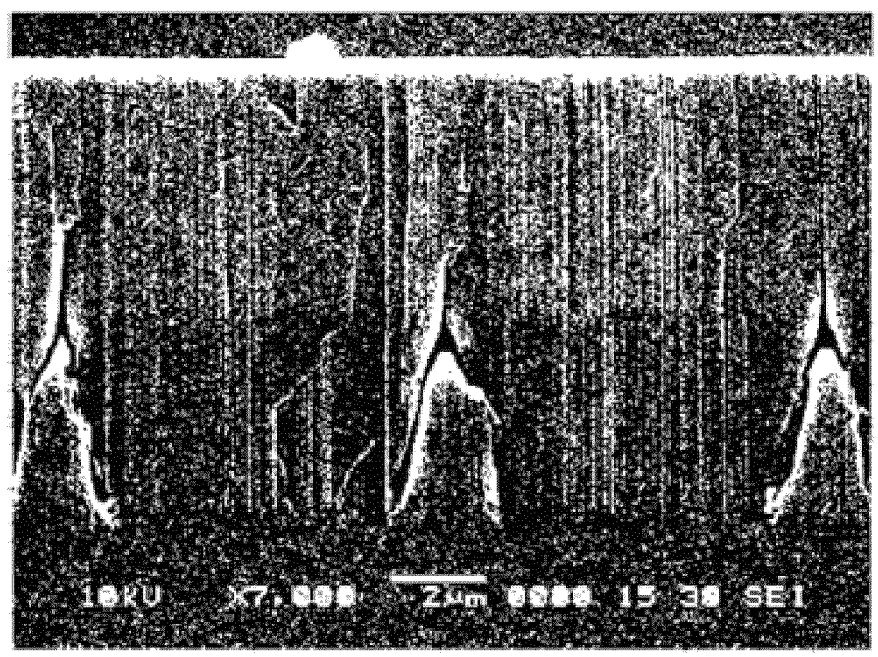

Based on the observation of the SEM images (bird's-eye views) of FIG. 7B and FIG. 9B, the recess upper region is completely covered with the second ELO layer 5 in Example 3 and with the first ELO layer 4 in Comparative Example 2, and no ridge-shape openings are found on each crystal surface. However, the step-flow that suggests two dimensional growth is observed on the surface of the second ELO layer 5 in Example 3 (not shown), and it is realized that the surface is fine and flat at the atomic level of 0.1 nm (RMS) in surface roughness. On the other hand, as depicted in FIG. 10, micro-steps having hexagonal hillocks is observed on the surface of the AlGaN layer in Comparative Example 2, and the surface roughness thereof is 14.1 nm (RMS) and is rougher than that of the second ELO layer 5 in Example 3 by 100 times or more. According to the results described above, it is clear that the crystal surface of the second ELO layer 5 in Example 3 is finer and more flat than the AlGaN layer in Comparative Example 2.

Moreover, each surface of the second ELO layer 5 in Example 3 and the AlGaN layer in Comparative Example 2 was analyzed by the x-ray rocking curve (XRC) method: the full widths at half maximum (FWHM, arcsec) of the tilt distribution (ω mode) and the twist distribution (ψ mode) of Example 3 were 218 and 472, respectively; and the full widths at half maximum (FWHM, arcsec) of the tilt distribution and the twist distribution of Comparative Example 2 were 305 and 674, respectively. Although the XRC analysis shows almost preferable results even in Comparative Example 2, it is realized that the surface properties are even better in Example 3 than in Comparative Example 2. Also from the XRC analysis result, it is clear that the second ELO layer 5 of Example 3 has a finer and more flat crystal surface than the AlGaN layer of Comparative Example 2. Accordingly, it is clear that, by stopping the growth of the first ELO layer 4 before the recess upper region is completely covered, the second ELO layer 5 (AlGaN layer) grown thereon can have a fine and flat surface at the atomic level.

Example 5 and Example 6

Figure 11:
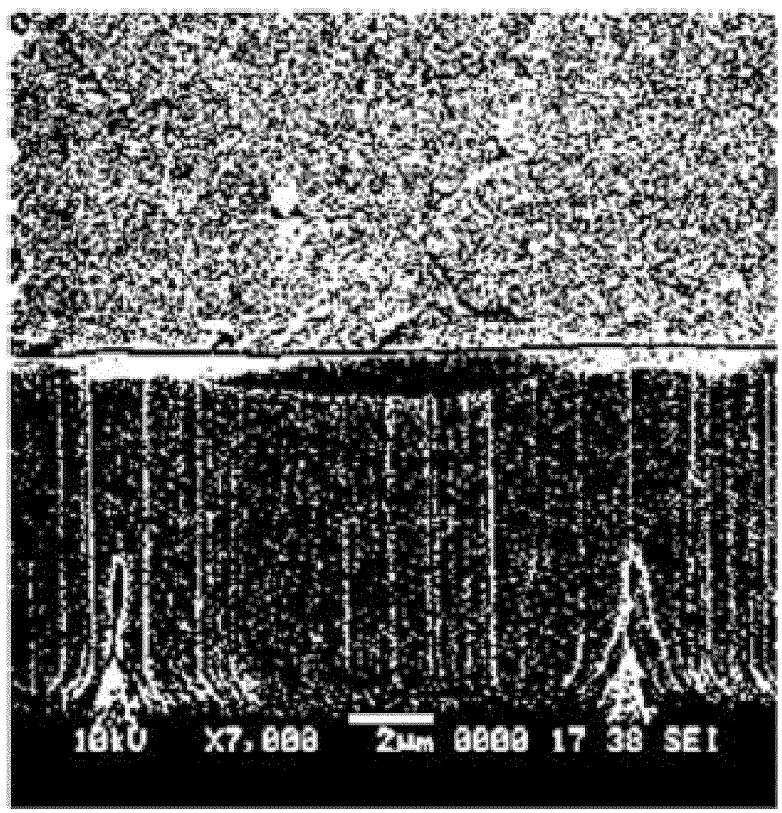
FIG. 11 is a SEM image (bird's-eye view), showing Example 5 of the template for epitaxial growth according to the present invention.
Figure 12:
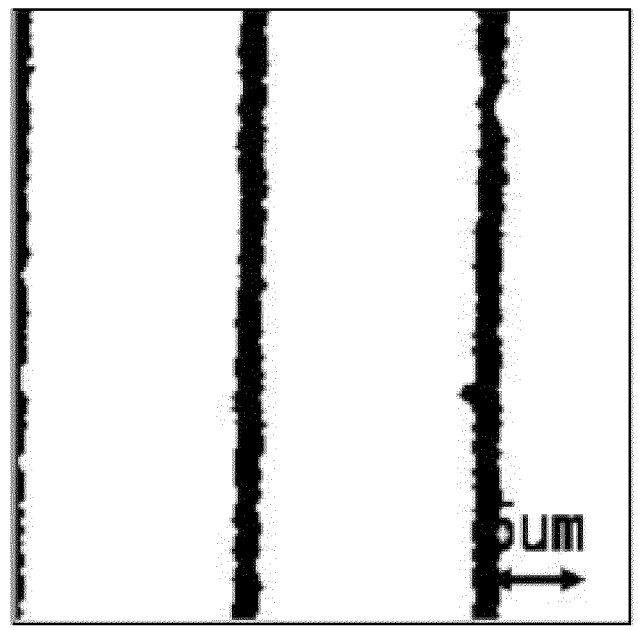
FIG. 12 is a differential interference microscopic image of a surface condition when a first ELO layer in Example 6 of the template for epitaxial growth according to the present invention is prevented from growing.

FIG. 11 shows the SEM image (bird's-eye view) of Example 5. FIG. 12 shows the differential interference microscopic image showing the state where the recess upper region is not completely covered after the first ELO layer 4 of Example 6 is formed. In Example 5 and Example 6, the width, interval, and depth of the grooves 6 formed on the surface of the sapphire substrate 2 are 2 μm, 10 μm, and 0.3 μm, respectively. The growth conditions (growth temperature and flow ratio) of the initial-stage AlN layer 3, the first ELO layer 4, and the second ELO layer 5 are set to be the same, respectively. The thicknesses of the initial-stage AlN layer 3, the first ELO layer 4, and the second ELO layer 5 are 1.6 μm, 2.1 μm, and 4.5 μm, respectively, in Example 5, and are 1.3 μm, 1.8 μm, and 1.5 μm, respectively, in Example 6. The void height of Example 5 is 3.7 μm. The Al molar fractions x of the second ELO layer 5 in Example 5 and Example 6 are 0.9, respectively.

Example 5 is different from other examples since the first ELO layer 4 is thicker, but is the same as other examples in a sense that the lateral overgrowth of the first ELO layer 4 is stopped before the recess upper region is completely closed. In the present invention, by laterally overgrowing two layers—the first ELO layer 4 and the second ELO layer 5—the growth conditions of the second ELO layer 5 are easily optimized, and the second ELO layer 5 with a fine and flat surface is obtained. Thus, as long as the first ELO layer 4 does not completely close the recess upper region, it is advantageous, if the layer is thick to some degree, for the optimization described above.

Accordingly, the results in Examples 1 to 6 show that when the first ELO layer 4 has a thickness of 1.8 μm or more, the recess upper region is completely closed with the second ELO layer 5 and the second ELO layer 5 with a fine and flat surface is provided. Specifically, as the first ELO layer 4 is made thinner, the second ELO layer 5 has to be made relatively thicker so as to completely close the recess upper region and thus it becomes gradually more difficult to optimize growth conditions for the lateral overgrowth of the second ELO layer 5. Therefore, it is preferable that the first ELO layer 4 has a thickness of 1.8 μm or more. However, since the grooves 6 have the width of 2 μm or more in Examples 1 to 6 described above, the first ELO layer 4 could be thinner if the grooves 6 have the width smaller than 2 μm. Therefore, although the working size of grooves does not limit carrying out the present production method, the working precision of the grooves 6 needs to be higher so as to provide a finer width for the grooves 6 and thus manufacturing costs may jump for the use of expensive processing equipment.

The differential interference microscopic image in FIG. 12 shows that the average length of the openings 11 after the formation of the first ELO layer 4 in Example 6 is about 1.5 μm. As the first ELO layer 4 becomes thick, the average opening length becomes small along with the progress in the lateral overgrowth of the first ELO layer 4. Thus, by providing the average opening length of 1.5 μm or less as described above, the growth condition of the second ELO layer 5 can be easily optimized and the second ELO layer 5 with a fine and flat surface is provided.

Figure 13:
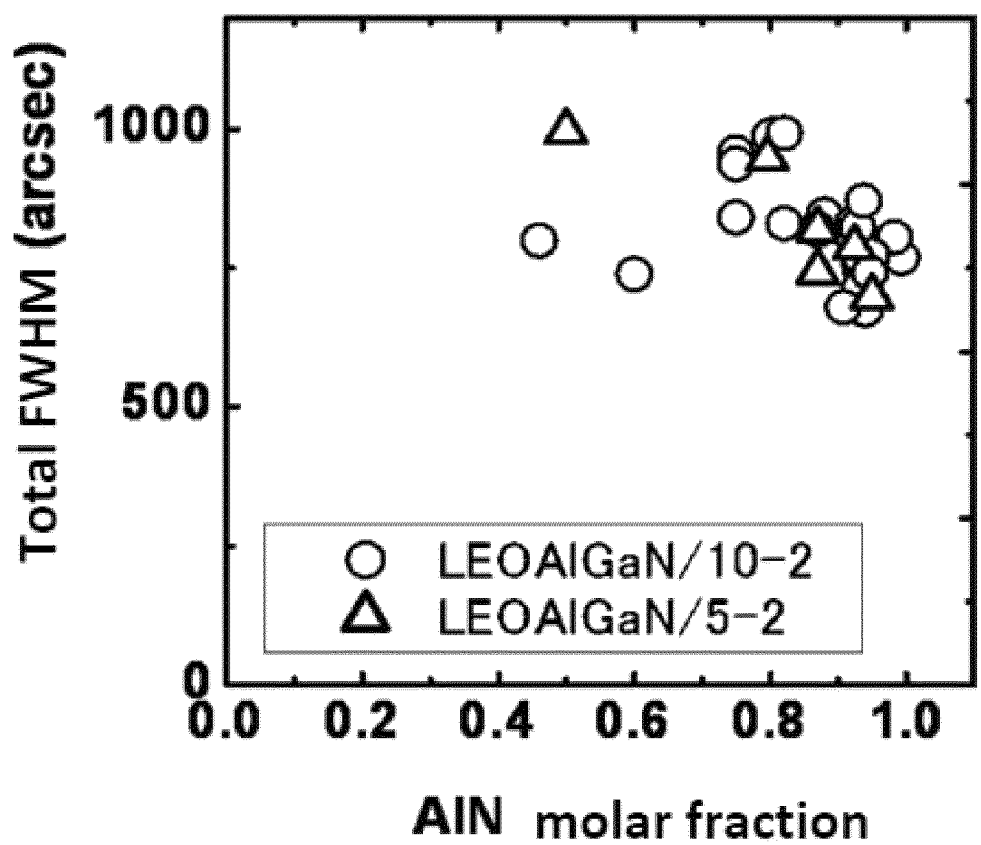
FIG. 13 shows a surface analysis result by the XRC method, of a second ELO layer of the templates for epitaxial growth according to the present invention.

Subsequently, FIG. 13 shows the analysis of the crystal surface of the second ELO layers 5 carried out by the XRC method for 34 samples, including some of the above-described examples, of the present template 1 produced by the present production method. The vertical axis of the graph in FIG. 13 indicates the total of each full width at half maximum (FWHM, arcsec) of the tilt distribution and the twist distribution, and the horizontal axis indicates the Al molar fraction x of the second ELO layer 5 ($Al_xGa_{1-x}N$ (0001) layer). As it is assumed that a light-emitting diode or a semiconductor laser having the ultraviolet region of 300 nm or less in emission wavelength is produced in this embodiment, the Al molar fraction shown in FIG. 13 is 0.4 or more, but the Al molar fraction of the second ELO layer 5 is not limited to 0.4 or more. In the figure, the open circles (◯) show samples (28 samples) of the grooves 6 having the width of 2 μm, the interval of 10 μm, and the depth of 0.3 μm; and the open triangles (Δ) show samples (six samples) of the grooves 6 having the width of 2 μm, the interval of 5 μm, and the depth of 0.3 μm. Based on the results shown in FIG. 13, it is found that the surface of the second ELO layer 5 is formed fine and flat without depending on a difference in the Al molar fractions of the second ELO layer 5 and the intervals of the groove 6.

Figure 14:
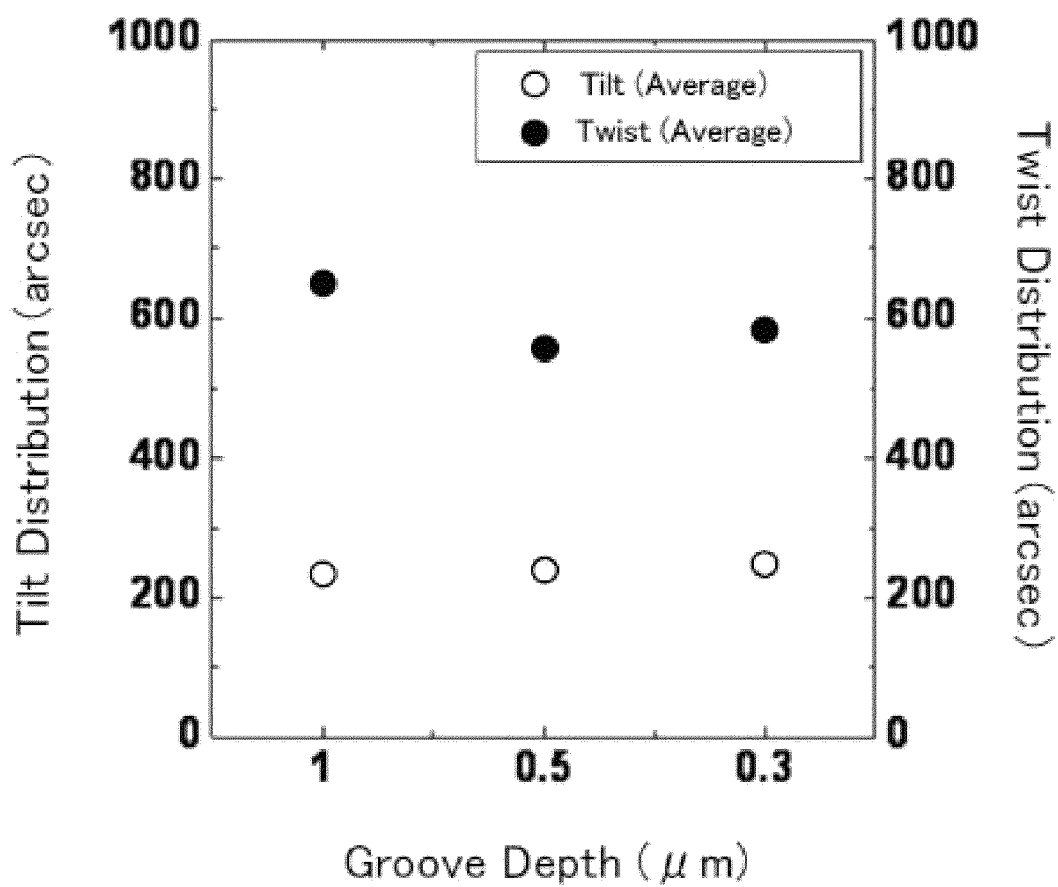
FIG. 14 shows a surface analysis result by the XRC method, of a first ELO layer in Reference Examples 1 to 3 of the templates for epitaxial growth according to the present invention.
Figure 15:
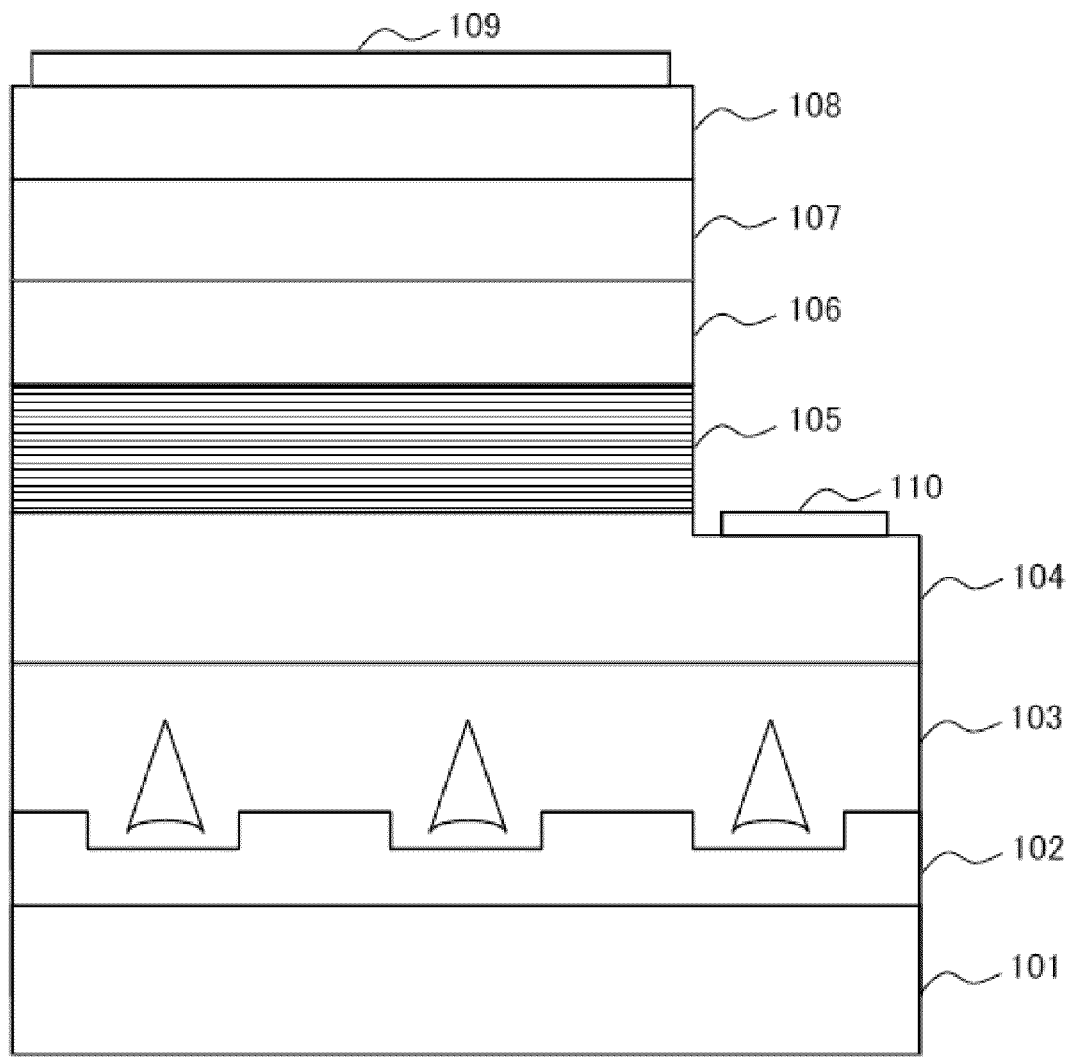
FIG. 15 is a cross-sectional view, schematically illustrating a typical crystal layer structure of a conventional GaN light-emitting diode.

Additionally, it was considered generally preferable to form deeper grooves in the surface of a sapphire substrate when an AlN layer or the like is directly and epitaxially grown on a sapphire substrate having recesses and protrusions in its surface by an epitaxial lateral overgrowth method (see for example, Non-patent Document 3). Specifically, when the grooves are shallow, a layer grown from the protrusions between the grooves and a layer grown from the inside of the grooves cannot be separated effectively, so that the effects from the lateral overgrowth would be insignificant. However, it is confirmed, in Examples 1 to 6, that preferable surface properties can be obtained for the second ELO layer 5 even when the grooves 6 formed on the surface of sapphire substrate 2 are relatively shallow at 0.3 μm. FIG. 14 shows the evaluation based on the surface properties of the first ELO layer 4, showing that the surface properties of the second ELO layer 5 do not vary significantly when the depth of the grooves 6 is within the range of about 0.3 μm to 1 μm.

FIG. 14 shows the XRC analysis of surface properties of the first ELO layer 4 of three samples (Reference Examples 1 to 3) wherein the initial-stage AlN layer 3 is grown under the same conditions as in Examples 1 to 3 on three kinds of the sapphire substrates 2 having the grooves 6 in the depth of 0.3 μm, 0.5 μm, and 1 μm, and then the first ELO layer 4 is grown on the layer 3 until the recess upper region is completely covered with the layer as in Comparative Example 2. In FIG. 14, open circles (◯) indicate the full width at half maximum (FWHM, arcsec) of tilt distribution, and solid circles (●) indicate the full width at half maximum (FWHM, arcsec) of twist distribution. Moreover, in Reference Examples 1 to 3, the width and interval of the grooves 6 formed on the surface of the sapphire substrate 2 are 3 µm and 5 µm, respectively. The thicknesses of the initial-stage AlN layer 3 and the first ELO layer 4 are 1.3 µm and 5 µm, respectively. According to the results shown in FIG. 12, when the grooves 6 have a depth within the range of about 0.3 µm to 1 µm, the surface properties of the first ELO layer 4 are similarly preferable. Thus, it is considered that the surface properties of the second ELO layer 5 of the present template 1 produced by the present production method described above also do not vary significantly within the range of about 0.3 µm to 1 µm in the depth of the grooves 6. When the groove depth is about 0.5 µm or less in the present production method, the sapphire substrate 2 receives less damage from the etching treatment to form grooves, so that the initial-stage AlN layer 3 with a higher quality is provided and also the costs of forming grooves may be cut, which is thus more preferable.

According to the description of the examples of the present template 1 and the comparative examples produced without depending on the present production method, it is clear that the second ELO layer 5 having a fine and flat surface and a reduced threading dislocation density is provided by providing the C+-axis oriented initial-stage AlN layer 3 and stopping the lateral overgrowth of the first ELO layer 4 before a recess upper region is completely covered with the layer, and then completely covering the recess upper region with the laterally overgrowing second ELO layer 5. Also, an AlGaN nitride semiconductor layer of high crystal quality is obtained by forming an AlGaN nitride semiconductor layer (AlGaNIn layer) that is included in an AlGaN nitride semiconductor device, such as a light-emitting diode and a semiconductor laser, on the second ELO layer 5 of the present template 1. Accordingly, an AlGaN nitride semiconductor device of superior performances is provided by using the present template 1.

The present production method and present template has been described above in detail. However, the characteristic of the present invention lies in the provision of a C+ axis oriented initial-stage AlN layer 3, a first ELO layer 4, and a second ELO layer 5. The above-noted process and conditions are simply an example for description, and these conditions and the like may be appropriately modified without departing from the present invention including the above characteristic.

In the embodiments mentioned above, as the C axis orientation control method by which it is possible to obtain the C+ axis oriented initial-stage AlN layer 3, which is the characteristic of the present invention, it has been described that flow ratios ($NH_3$/TMA) were adjusted so as to orient the layer to C axis; however the C axis orientation control method may be accomplished by controlling with reaction gas, supplying TMA earlier at the initial-growth stage or the like, instead of adjusting the flow ratios. Moreover, for the above-noted description, the metalorganic vapor phase epitaxy (MOVPE) is applied as the method of growing the initial-stage AlN layer 3, the first ELO layer 4, and the second ELO layer 5, but the hydride VPE (vapor phase epitaxy) method may be applied as the growth method instead of MOVPE. Furthermore, in the embodiments, although the surface of the sapphire (0001) substrate 2 is processed to form recesses and protrusions by photolithography and anisotropic etching, as the recesses and protrusions forming process, processing methods other than anisotropic etching may be applied as long as flat protrusion tops are provided.

INDUSTRIAL APPLICABILITY

The template for epitaxial growth and the method for producing the same according to the present invention are applicable to produce an AlGaN nitride semiconductor device such as a light-emitting diode and a semiconductor laser.

EXPLANATION OF REFERENCES

1: Template for epitaxial growth
2: Sapphire (0001) substrate
3: Initial-stage AlN layer
4: First ELO layer (AlN (0001) layer)
5: Second ELO layer (($Al_xGa_{1-x}N$ (0001) layer)
6: Groove formed on the surface of the sapphire substrate
7: Ni mask
8: Protrusion top
9: Second recess (recess of the initial-stage AlN layer)
10: Protrusion surface of the initial-stage AlN layer
11: Opening
12: Lower layer region of the recess upper region

The invention claimed is:

1. A method for producing a template for epitaxial growth, comprising:
processing a surface of a sapphire (0001) substrate to form recesses and protrusions on the surface so that protrusion tops are made flat and have a given plan-view pattern;
epitaxially growing an initial-stage AlN layer on the surface of the sapphire (0001) substrate having the recesses and protrusions by performing C axis orientation control so that a C+ axis oriented AlN layer grows on flat surfaces of the protrusion tops, excluding edges, and that the AlN layer deposited on the recesses obtained by the recesses and protrusions forming process forms new recesses over the recesses;
epitaxially growing a first ELO layer including an AlN (0001) layer, on the initial-stage AlN layer by an epitaxial lateral overgrowth method;
stopping the first ELO layer from growing before a recess upper region above the new recesses is completely covered with the first ELO layer that is laterally grown from a protrusion upper surface of the initial-stage AlN layer, and then epitaxially growing a second ELO layer including an $Al_xGa_{1-x}N$ (0001) layer (1>x>0) layer by an epitaxial lateral overgrowth method; and
covering the recess upper region completely with the second ELO layer that is laterally grown from an upper surface of the first ELO layer.

2. The method for producing a template for epitaxial growth according to claim 1, wherein an average length of an opening is 1.5 µm or less, the opening being formed at an upper surface of the recess upper region when the first ELO layer stops growing, the average length of the opening being along a spacing direction of two of the protrusion tops which are adjacent to each other with the recess upper region being interposed therebetween.

3. The method for producing a template for epitaxial growth according to claim 1, wherein the first ELO layer is grown on a protrusion upper surface of the initial-stage AlN layer by at least 1.8 µm.

4. The method for producing a template for epitaxial growth according to claim 1, wherein the initial-stage AlN layer, the first ELO layer, and the second ELO layer are epitaxially grown respectively at a temperature below 1,300° C.

5. The method for producing a template for epitaxial growth according to claim 1, wherein the recesses are formed on the surface of the sapphire (0001) substrate at a depth of 1.0 µm or less.

6. The method for producing a template for epitaxial growth according to claim 1, wherein an AlN layer that is not oriented in C+-axis is grown near steps formed by the recesses and protrusions during the growth of the initial-stage AlN layer.

7. A nitride semiconductor device comprising:
a sapphire (0001) substrate processed to form recesses and protrusions on its surface so that protrusion tops are made flat and have a given plan-view pattern;
an initial-stage AlN layer epitaxially grown on the surface of the sapphire (0001) substrate having the recesses and protrusions;
a first ELO layer including an AlN (0001) layer, epitaxially grown on the initial-stage AlN layer by an epitaxial lateral overgrowth method; and
a second ELO layer including an $Al_xGa_{1-x}N$ (0001) layer (1>x>0) that is epitaxially grown on the first ELO layer by an epitaxial lateral overgrowth method,
wherein the initial-stage AlN layer is provided so that a C+ axis oriented AlN layer grows on flat surfaces of the protrusion tops, excluding edges, and that the AlN layer deposited on the recesses obtained by the recesses and protrusions forming process forms new recesses over the recesses, and
at least a part of an upper surface of a lower layer region is open without being covered with the first ELO layer, but is completely covered with the second ELO layer that is laterally grown from an upper surface of the first ELO layer, the lower layer region being in a recess upper region above the new recess and sandwiched with the first ELO layer laterally grown from protrusion tops of the initial-stage AlN layer.

8. The nitride semiconductor device according to claim 7, wherein an average length of an opening is 1.5 μm or less, the opening being formed at the upper surface of the lower layer region of the recess upper region, the average length of the opening being along a spacing direction of two of the protrusion tops which are adjacent to each other with the recess upper region being interposed therebetween.

9. The nitride semiconductor device according to claim 7, wherein the first ELO layer grown on protrusion upper surfaces of the initial-stage AlN layer, is in a thickness of 1.8 μm or more.

10. The nitride semiconductor device according to claim 7, wherein the recesses formed on the surface of the sapphire (0001) substrate, have a depth of 1.0 μm or less.

11. The nitride semiconductor device according to claim 7, wherein the initial-stage AlN layer includes an AlN layer that is not oriented in C+-axis near steps formed by the recesses and protrusions.

12. The method for producing a template for epitaxial growth according to claim 2, wherein the first ELO layer is grown on a protrusion upper surface of the initial-stage AlN layer by at least 1.8 μm.

13. The method for producing a template for epitaxial growth according to claim 2, wherein the initial-stage AlN layer, the first ELO layer, and the second ELO layer are epitaxially grown respectively at a temperature below 1,300° C.

14. The method for producing a template for epitaxial growth according to claim 2, wherein the recesses are formed on the surface of the sapphire (0001) substrate at a depth of 1.0 μm or less.

15. The method for producing a template for epitaxial growth according to claim 2, wherein an AlN layer that is not oriented in C+-axis is grown near steps formed by the recesses and protrusions during the growth of the initial-stage AlN layer.

16. The nitride semiconductor device according to claim 8, wherein the first ELO layer grown on protrusion upper surfaces of the initial-stage AlN layer, is in a thickness of 1.8 μm or more.

17. The nitride semiconductor device according to claim 8, wherein the recesses formed on the surface of the sapphire (0001) substrate, have a depth of 1.0 μm or less.

18. The nitride semiconductor device according to claim 8, wherein the initial-stage AlN layer includes an AlN layer that is not oriented in C+-axis near steps formed by the recesses and protrusions.

* * * * *